United States Patent
Hossain et al.

(10) Patent No.: US 12,471,351 B2
(45) Date of Patent: Nov. 11, 2025

(54) SHIELDED GATE TRENCH POWER MOSFET WITH HIGH-K SHIELD DIELECTRIC

(71) Applicant: SEMICONDUCTOR COMPONENTS INDUSTRIES, LLC, Phoenix, AZ (US)

(72) Inventors: Zia Hossain, Tempe, AZ (US); Balaji Padmanabhan, Chandler, AZ (US); Christopher Lawrence Rexer, Scottsdale, AZ (US); Gordon M. Grivna, Mesa, AZ (US); Sauvik Chowdhury, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 620 days.

(21) Appl. No.: 17/650,456

(22) Filed: Feb. 9, 2022

(65) Prior Publication Data

US 2023/0253468 A1    Aug. 10, 2023

(51) Int. Cl.
*H10D 64/00*    (2025.01)
*H10D 30/01*    (2025.01)
*H10D 30/66*    (2025.01)
*H10D 64/27*    (2025.01)

(52) U.S. Cl.
CPC ....... *H10D 64/513* (2025.01); *H10D 30/0297* (2025.01); *H10D 30/665* (2025.01); *H10D 30/668* (2025.01); *H10D 64/118* (2025.01)

(58) Field of Classification Search
CPC .......................... H01L 29/4236; H10D 64/513
See application file for complete search history.

(56) References Cited

U.S. PATENT DOCUMENTS

| | | |
|---|---|---|
| 10,304,933 B1 * | 5/2019 | Woo .................. H01L 21/28035 |
| 11,127,852 B2 | 9/2021 | Kim et al. |
| 2004/0113202 A1 | 6/2004 | Kocon et al. |
| 2005/0167742 A1 | 8/2005 | Challa et al. |
| 2009/0050959 A1 | 2/2009 | Madson |

(Continued)

FOREIGN PATENT DOCUMENTS

| | | |
|---|---|---|
| CN | 105957894 A | 9/2016 |
| CN | 107170827 A | 9/2017 |

OTHER PUBLICATIONS

International Search Report and Written Opinion for counterpart application No. PCT/2023/061593, mailed May 23, 2023, 16 pages.

(Continued)

*Primary Examiner* — Douglas M Menz
(74) *Attorney, Agent, or Firm* — Brake Hughes Bellermann LLP

(57) ABSTRACT

In one general aspect, an apparatus can include a substrate having a semiconductor region, and a trench defined in the semiconductor region and having a sidewall. The apparatus can include a shield electrode disposed in the trench and insulated from the sidewall of the trench by a shield dielectric, the shield dielectric having a low-k dielectric portion and a high-k dielectric portion. The apparatus can include a gate electrode disposed in the trench and at least partially surrounded by a gate dielectric, and an inter-electrode dielectric disposed between the shield electrode and the gate electrode.

23 Claims, 17 Drawing Sheets

(56) References Cited

U.S. PATENT DOCUMENTS

| | | | |
|---|---|---|---|
| 2010/0059797 A1* | 3/2010 | Ngai | H10D 62/405 |
| | | | 257/330 |
| 2010/0171171 A1 | 7/2010 | Hsu et al. | |
| 2012/0187474 A1* | 7/2012 | Rexer | H10D 30/665 |
| | | | 438/270 |
| 2012/0235230 A1 | 9/2012 | Park et al. | |
| 2012/0313161 A1 | 12/2012 | Grivna et al. | |
| 2012/0326227 A1 | 12/2012 | Burke et al. | |
| 2013/0168729 A1 | 7/2013 | Chen | |
| 2014/0015039 A1 | 1/2014 | Hossain | |
| 2014/0209999 A1 | 7/2014 | Sato et al. | |
| 2020/0243656 A1* | 7/2020 | Shibib | H01L 29/404 |

OTHER PUBLICATIONS

Chen, Xingbi, and Mingmin Huang. "A vertical power MOSFET with an interdigitated drift region using high-k insulator." IEEE transactions on electron devices 59:9 (2012): pp. 2430-2437.

Luo, Xiaorong, Bo Zhang, and Zhaoji Li. "A new structure and its analytical model for the electric field and breakdown voltage of SOI high voltage device with variable-k dielectric buried layer." Solid-State Electronics 51:3 (2007): pp. 493-499.

International Preliminary Report on Patentability for PCT Application No. PCT/US2023/061593, mailed on Aug. 22, 2024, 12 pages.

* cited by examiner

SHIELDED GATE TRENCH POWER MOSFET WITH HIGH-K SHIELD DIELECTRIC

TECHNICAL FIELD

This description generally relates to a shielded gate trench power metal-oxide-semiconductor field effect transistor (MOSFET) with a high-k shield dielectric.

BACKGROUND

A specific ON-resistance of a shielded gate vertical power metal-oxide-semiconductor field effect transistor (MOSFET) can be reduced by increasing the doping in a mesa region. However, to maintain breakdown voltage in response to this increased doping, the shield dielectric MOS capacitance would need to be increased to deplete the increased dopant in the mesa region. Known MOSFET structures with a desirable ON-resistance and a desirable breakdown voltage have many drawbacks including, for example, problematic charge balance conditions and/or structures that are expensive or difficult to produce.

SUMMARY

In one general aspect, an apparatus can include a substrate having a semiconductor region, and a trench defined in the semiconductor region and having a sidewall. The apparatus can include a shield electrode disposed in the trench and insulated from the sidewall of the trench by a shield dielectric, the shield dielectric having a low-k dielectric portion and a high-k dielectric portion. The apparatus can include a gate electrode disposed in the trench and at least partially surrounded by a gate dielectric, and an inter-electrode dielectric disposed between the shield electrode and the gate electrode. These high-k shield dielectric portions can be introduced in selected regions as part of the shield dielectric to modify the capacitance of the shield MOS capacitor of the MOSFETs.

The details of one or more implementations are set forth in the accompanying drawings and the description below. Other features will be apparent from the description and drawings, and from the claims.

DETAILED DESCRIPTION

The shielded gate trench power metal-oxide-semiconductor field effect transistors (MOSFETs) described herein include a high-k shield dielectric portion and/or a low-k shield dielectric portion. The high-k shield dielectric portions can include, for example, $SiN_x$, $Al_2O_3$, $HfO_2$, $La_2O_3$, and/or so forth with dielectric constants greater than approximately 4, and the low-k shield dielectric portions can include oxides such as $SiO_2$ with dielectric constants less than approximately 4. These high-k shield dielectric portions can be introduced in selected regions as part of the shield dielectric to modify the capacitance of the shield MOS capacitor of the MOSFETs. In some implementations, the high-k dielectric portions can result in an increase in the capacitance (e.g., output capacitance) of the shield dielectric without reducing shield dielectric thickness to an undesirable level.

The implementations described herein can be contrasted with some MOSFET devices that have relatively thin shield dielectric portions that are susceptible to low breakdown voltages. For example, some step-shaped shield polysilicon structures (e.g., shield polysilicon structures with a wider top portion and narrower lower portion) can have undesirable low breakdown voltages across a top of the shield dielectric especially in a termination region. In some implementations, to ensure good device reliability, the dielectric electric field can be limited to a certain value (~4 MV/cm). This results in a limitation in how much the top shield dielectric can be thinned and/or doping near the top of the mesa region. Some steps (e.g., mask the step shield oxide etch) associated with the termination trench, for example, can be masked to resolved some of the issues above, but this results in an additional photo process and also changes the charge balance condition in the last active trench.

In some implementations, shield dielectric thickness can be decreased in conjunction with a high-k dielectric portion being included in the MOSFETs. In some implementations, the heights and/or thicknesses of high-k dielectric portions can be optimized in conjunction with mesa doping levels to achieve desired breakdown voltages and/or capacitance characteristics. In some implementations, high-k dielectric portions can be combined with a step-shaped shield dielectric structures. In some implementations, high-k dielectric portions can be used to modify the strain in a silicon mesa region, which can increase electron mobility and/or decrease on-resistance.

Figure 1:
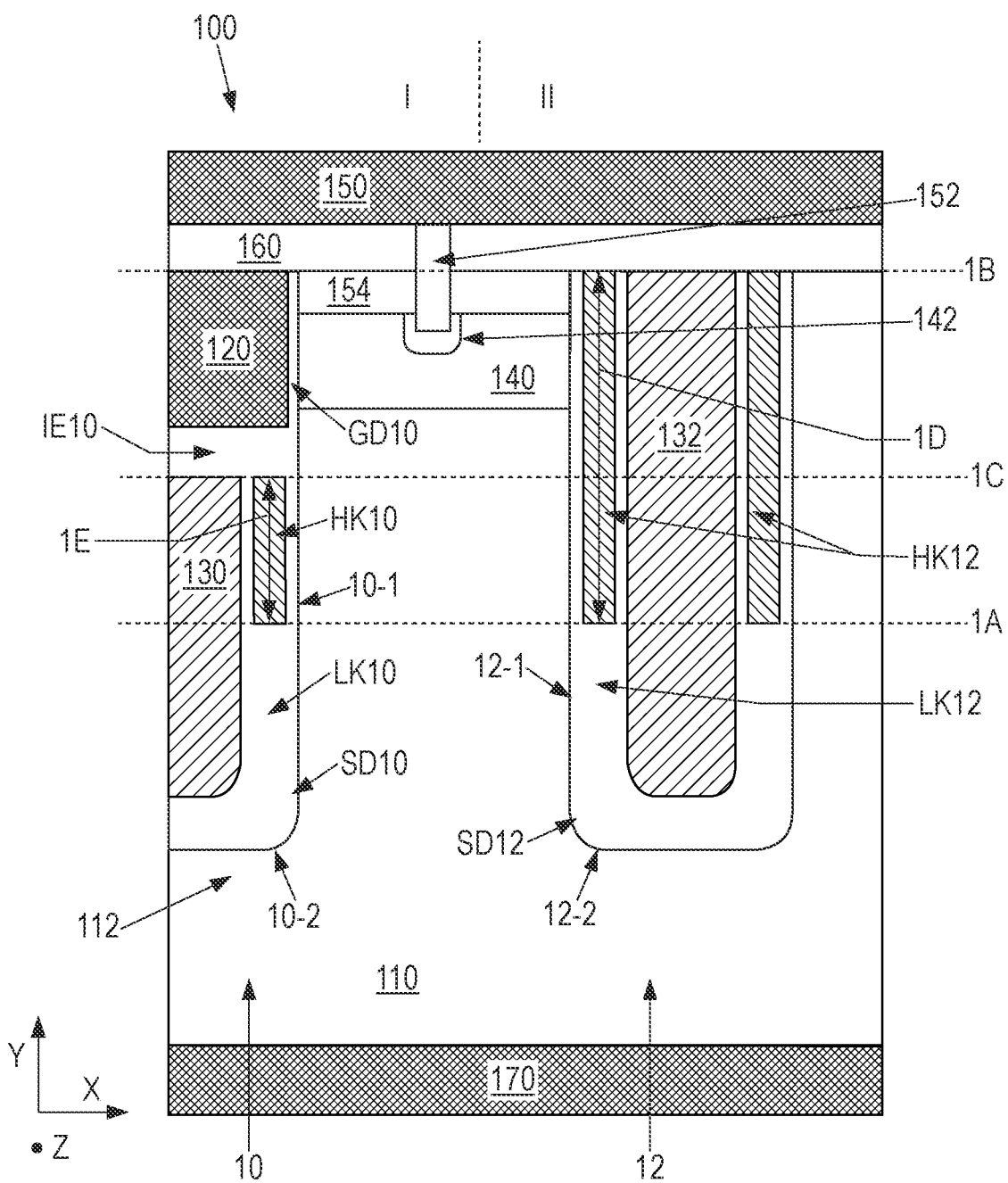
FIG. 1 illustrates an example semiconductor device that includes examples of an active trench and a termination trench that each include a high-k dielectric portion.

FIG. 1 illustrates an example semiconductor device 100 that includes examples of an active trench 10 and a termination trench 12 that each include a high-k dielectric portion. The high-k dielectric portions are shown in active trench 10 and in termination trench 12 in FIG. 1 as high-k dielectric portions HK10 and HK12, respectively. In some implementations, the high-k dielectric portions HK10 and/or HK12 can result in an increase in the capacitance (e.g., output capacitance) of the associated shield dielectrics without reducing shield dielectric thickness to an undesirable level.

As shown in FIG. 1, the active trench 10 (and portion of the semiconductor device 100) is in an active region I, and the termination trench 12 (and portion of the semiconductor device 100) is in the termination region II. In this figure, only half of the active trench 10 (and device) and the full termination trench 12 (and device) are shown. The active trench 10 (and device), like the termination trench 12 (and device), is symmetrical around the cut line of each of the trenches 10, 12. In many of the figures below, only half of the termination trench 12 is shown, and the active trench 10 (and device) and the termination trench 12 (and device) are symmetrical around a vertical cut line of each of the trenches 10, 12.

The active trench 10 includes a gate electrode 120 disposed within the active trench 10 and disposed above an active shield electrode 130, which is also disposed in the active trench 10. The termination trench 12 includes a termination shield electrode 132, which is disposed in the termination trench 12.

As shown in FIG. 1, the active shield dielectric SD10 includes the low-k dielectric portion LK10 and a high-k dielectric portion HK10. The low-k dielectric portion LK10 is in contact with the high-k dielectric portion HK10. In this example implementation, the high-k dielectric portion HK10 is included in, or surrounded by the low-k dielectric portion LK10.

Similar to the active trench 10, the termination trench 12 includes a termination shield dielectric SD12 that includes a low-k dielectric portion LK12 and a high-k dielectric portion HK12. The low-k dielectric portion LK12 is in contact with the high-k dielectric portion HK12. In this example implementation, the high-k dielectric portion HK12 is included in, or surrounded by the low-k dielectric portion LK12.

In some implementations, the active shield dielectric SD10 and/or the termination shield dielectric SD12 can be formed using one or more dielectrics. In other words, the active shield dielectric SD10 and/or the termination shield dielectric SD12 can be formed using one or more dielectric formation processes.

As shown in FIG. 1, the semiconductor device 100 includes a substrate 110 having a semiconductor region 112 in which the active trench 10 and the termination trench 12 are formed. In some implementations, the substrate 110 can be of a first conductivity type (e.g., N-type conductivity). In some implementations, the semiconductor region 112 can include one or more epitaxial regions. The portion of the substrate 110 between the trenches 10, 12 can be referred to as a mesa or a mesa region.

FIG. 1, many of the cross-sections within the application, are cross-sectional views. Specifically, FIG. 1 illustrates a cross-section across a width (along the X-direction) of each of the active trench 10 and the termination trench 12. The active trench 10 and the termination trench 12 are vertically (along the Y-direction) oriented within the semiconductor region 112. The active trench 10 and the termination trench 12 are aligned parallel to each other along the Z-direction.

In this semiconductor device 100, a source 150 (toward a top portion) is opposite a drain 170 (toward on a bottom portion). In some implementations, the source 150 can include a source contact or source metal. In some implementations, the drain 170 can include a drain contact or drain metal.

A well region 140 is formed in the semiconductor region 112. The well region 140 is formed in a top portion of the substrate 110 adjacent to the active trench 10. The well region 140 is formed in a top portion of the substrate 110 adjacent to the termination trench 12. In some implementations, the well region 140 can be of a second conductivity type (e.g., P-type conductivity).

In this implementation, the source 150 is electrically connected to the well region via a heavily doped well region 142. The heavily doped well region 142 has a doping concentration greater than that of the well region 140. The source 150 is electrically connected to the well region 142 via a source contact 152. In some implementations, the heavily doped well region 142 can be of a second conductivity type (e.g., P-type conductivity).

In this implementation, the source 150 is also electrically connected to a source region 154. In some implementations, the source 154 can be of a first conductivity type (e.g., N-type conductivity) opposite that of the well region 140 and the heavily doped well region 142. In some implementations, the source region 154 can be a heavily doped region. The source region 154 can have a least a portion insulated from the source 150 by a dielectric 160 (e.g., a borophosphosilicate glass (BPSG)).

The active trench 10 has a sidewall 10-1 and a bottom surface 10-2. The active shield dielectric SD10 lines the sidewall 10-1 and the bottom surface 10-2 of the active trench 10 and insulates the active shield electrode 130 from the substrate 110. Accordingly, the active shield dielectric SD10 is disposed between the active shield electrode 130 and the sidewall 10-1 of the active trench 10.

The termination trench 12 has a sidewall 12-1 and a bottom surface 12-2. The termination shield dielectric SD12 lines the sidewall 12-1 and the bottom surface 12-2 of the termination trench 12 and insulates the termination shield electrode 132 from the substrate 110. Accordingly, the termination shield dielectric SD12 is disposed between the termination shield electrode 132 and the sidewall 12-1.

An inter-electrode dielectric IE10 is disposed between the gate electrode 120 and the active shield electrode 130. The inter-electrode dielectric IE10 insulates the gate electrode 120 from the active shield electrode 130. In some implementations, the inter-electrode dielectric IE10 can be formed with, or can include, one or more dielectrics (e.g., using one or more dielectric formation processes).

The gate dielectric GD10 lines the sidewall 10-1 of the active trench 10 around the gate electrode 120. The gate dielectric GD10 insulates the gate electrode 120 from the substrate 110 and partially surrounds the gate electrode 120. Accordingly, the gate dielectric GD10 is disposed between the gate electrode 120 and the sidewall 10-1 of the active trench 10.

As shown in FIG. 1, the high-k dielectric portion HK12 in the termination trench 12 has a depth (at a bottom end) in the semiconductor region 112 that is the same as (e.g., approximately the same as) a depth (at a bottom end) of the high-k dielectric portion HK10 in the active trench 10. The depth is illustrated by dashed line 1A in FIG. 1.

As shown in FIG. 1, the high-k dielectric portion HK12 in the termination trench 12 has a depth (at a top end) shown by dashed line 1B in the semiconductor region 112 that is higher than a depth (at a top end) shown by dashed line 1C of the high-k dielectric portion HK10 in the active trench 10.

In some implementations, the top end of the high-k dielectric portion HK12 in the termination trench 12 is at a same height (e.g., substantially the same height) as the termination shield electrode 132 as shown by dashed line 1B. In some implementations, the top end of the high-k dielectric portion HK12 in the termination trench 12 can be lower or higher than the height as the termination shield electrode 132 as shown by dashed line 1B. In some implementations, the top end of the termination shield electrode 132 can be above or below the dashed line 1B.

In some implementations, the top end of the high-k dielectric portion HK10 in the active trench 10 is at a same height (e.g., substantially the same height) as the active shield electrode 130 as shown by dashed line 1C. In some implementations, the top end of the high-k dielectric portion HK10 in the active trench 10 can be lower or higher than the height as the active shield electrode 130 as shown by dashed line 1C.

An overall height 1D of the high-k dielectric portion HK12 in the termination trench 12 is greater than an overall height 1E of the high-k dielectric portion HK10 in the active trench 10. Accordingly, a size (e.g., volume) of the high-k dielectric portion HK12 in the termination trench 12 is greater than a size (e.g., volume) of the high-k dielectric portion HK10 in the active trench 10.

In this implementation, the high-k dielectric portion HK10 does not contact (e.g., laterally contact) the active shield electrode 130 and/or the sidewall 10-1. As shown, a portion of the low-k dielectric portion LK10 is disposed between the high-k dielectric portion HK10 and the sidewall 10-1. Also, in this implementation, the high-k dielectric portion HK12 does not contact (e.g., laterally contact) the termination shield electrode 132 and/or the sidewall 12-1. As shown, a portion of the low-k dielectric portion LK12 is disposed between the high-k dielectric portion HK12 and the sidewall 12-1. In this implementation, each of the high-k dielectric portions HK10, HK12 has a uniform width (e.g., X-direction width) along the vertical direction (e.g., Y-direction).

In some implementations, the semiconductor device 100 can include multiple active trenches such as active trench 10. In some implementations, the semiconductor device 100 can include multiple termination trenches such as termination trench 12.

In some implementations, conductivity types can be reversed from those described herein. For example, a first region and a second region that are respectively first conductivity type (e.g., N-type conductivity) and a second conductivity type (e.g., P-type conductivity), can be reversed and formed with a second conductivity type and a first conductivity type.

The high-k dielectric portions HK10, HK12 can have different shapes that shown in FIG. 1. For example, one or more of the high-k dielectric portions HK10, HK12 can be larger (e.g., taller, lower in depth, wider, etc.) than shown. In some implementations, one or more of the high-k dielectric portions HK10, HK12 can be wider (e.g., wider along the x-direction) than shown. For example, high-k dielectric portion HK10 can be in contact with the active shield electrode 130 and/or the sidewall 10-1. In some implementations, one or more of the high-k dielectric portions HK10, HK12 can have a non-uniform width along the vertical direction (e.g., Y-direction). In some implementations, one or more of the high-k dielectric portions HK10, HK12 can start at a different height (e.g., depth within their respective trench), and/or can terminate at a different height (e.g., depth within their respective trench). In some implementations, one or more of the low-k dielectric portions LK10, LK12 can be smaller or can be eliminated, which would result in one or more of the high-k dielectric portions HK10, HK12 being larger.

Many of the variations described above are shown and described in connection with, for example, FIGS. 2A through 2H. The elements that are the same as those shown and described in connection with FIG. 1 are not described again, but are labeled. Also, not all features are described again, if the feature has already been described in another of the figures.

Figure 2A:
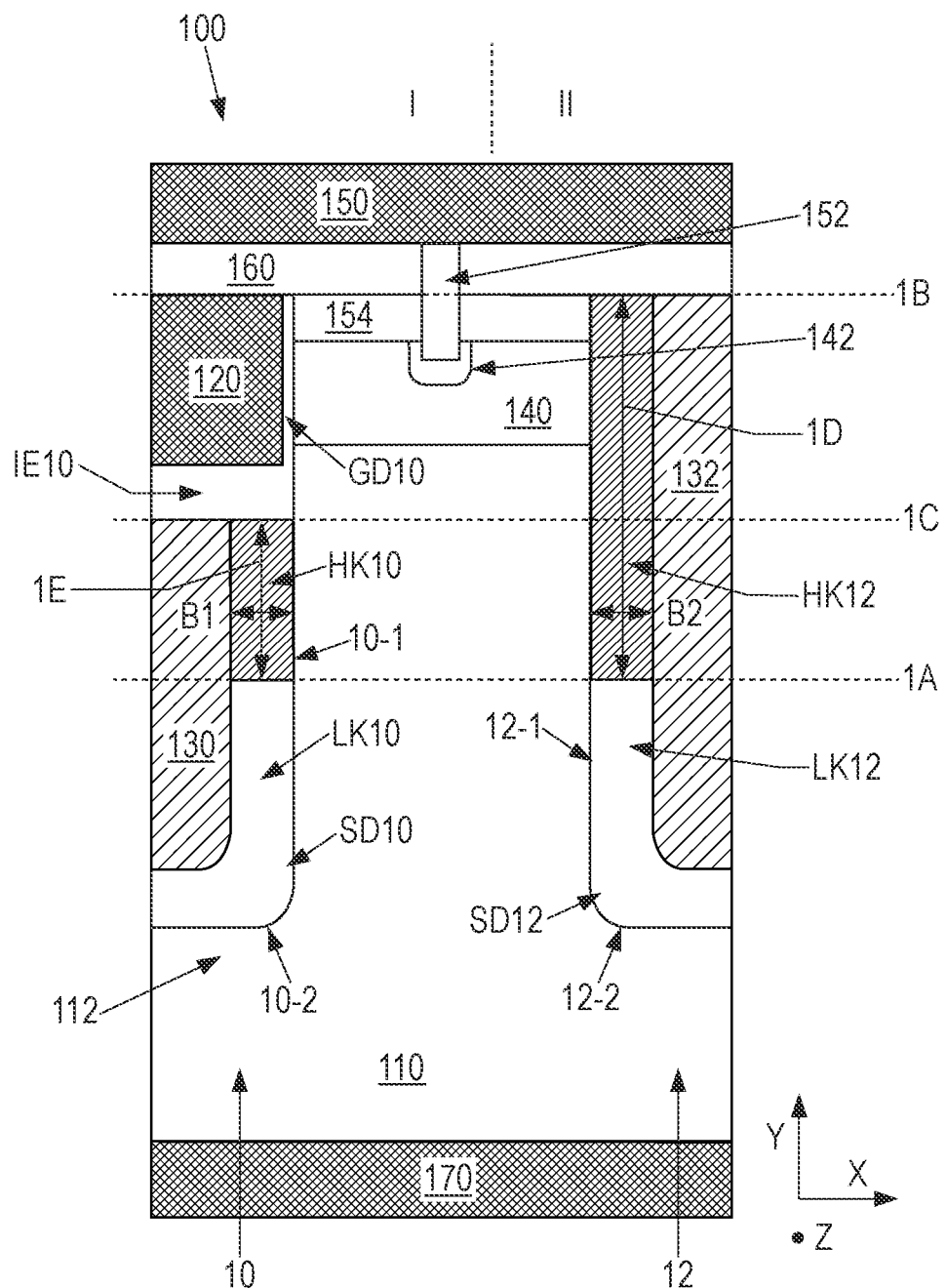
FIGS. 2A through 2H illustrate variations of the semiconductor device shown in FIG. 1.

FIG. 2A illustrates a variation of the semiconductor device 100 shown in FIG. 1. In this implementation, the high-k dielectric portion HK10 of the active shield dielectric SD10 has a width B1 that extends from the active shield electrode 130 to the sidewall 10-1 of the active trench 10. Accordingly, the low-k dielectric portion LK10 does not contact (or extend vertically to) the inter-electrode dielectric IE10. The low-k dielectric portion LK10 does not have a height that extends to a top of the active shield electrode 130. In other words, the high-k dielectric portion HK10 is disposed between the low-k dielectric portion LK10 and the inter-electrode dielectric IE10.

Also, in this implementation, the high-k dielectric portion HK12 of the termination shield dielectric SD12 has a width B2 that extends from the termination shield electrode 132 to the sidewall 12-1 of the termination trench 12. Accordingly, the low-k dielectric portion LK12 does not contact (or extend vertically to) the dielectric 160. The low-k dielectric portion LK12 does not have a height that extends to a top of the termination shield electrode 132. In other words, the high-k dielectric portion HK12 is disposed between the low-k dielectric portion LK12 and the dielectric 160.

Figure 2B:
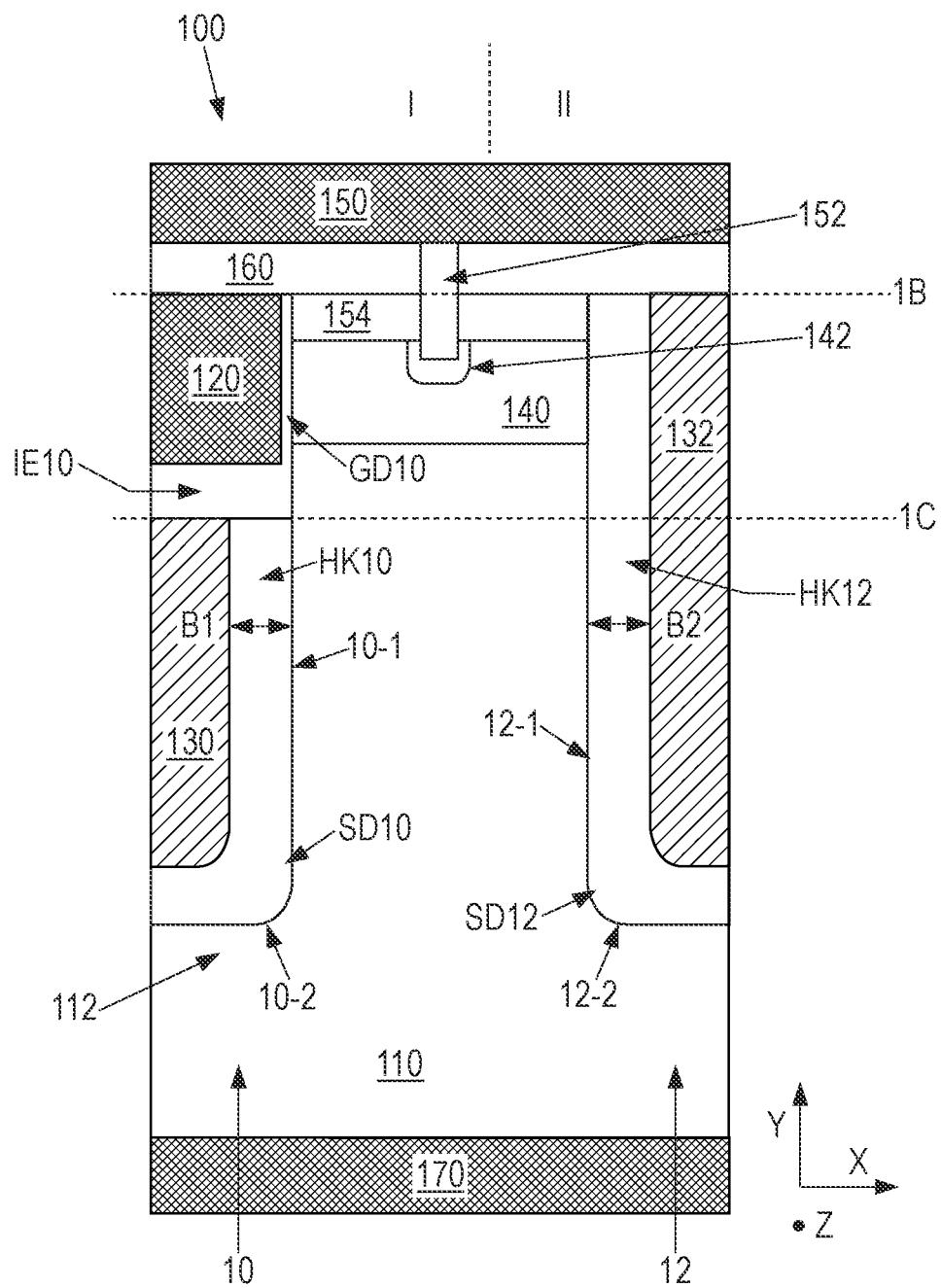

FIG. 2B illustrates a variation of the semiconductor device 100 shown in FIG. 1. In this implementation, the high-k dielectric portion HK10 of the active shield dielectric SD10 has a width B1 that extends from the active shield electrode 130 to the sidewall 10-1 of the active trench 10. Also, the low-k dielectric portion LK10 is entirely excluded from the active shield dielectric SD10. The high-k dielectric portion HK10 has a height that extends to a top of the active shield electrode 130 (at line 1C) and bottom of the inter-electrode dielectric IE10. In other words, the high-k dielectric portion HK10 makes up an entirety of the active shield dielectric SD10 and the active shield electrode 130 is insulated from the semiconductor region 112 (or substrate 110) via the high-k dielectric portion HK10. The high-k dielectric portion HK10 has a portion that is below the active shield electrode 130 and contacts a bottom surface 10-2 of the active trench 10.

Also, in this implementation, the high-k dielectric portion HK12 of the termination shield dielectric SD12 has a width B2 that extends from the termination shield electrode 132 to the sidewall 12-1 of the termination trench 12. The low-k dielectric portion LK12 is entirely excluded from the termination shield dielectric SD12. The high-k dielectric portion HK12 has a height that extends to the dielectric 160. The high-k dielectric portion HK12 makes up an entirety of the termination shield dielectric SD12 and the termination shield electrode 132 is insulated from the semiconductor region 112 (or substrate 110) via the high-k dielectric portion HK12. The high-k dielectric portion HK12 has a portion that is below the termination shield electrode 132 and contacts a bottom surface 12-2 of the termination trench 12.

The implementation shown in FIG. 2B with the entire shield dielectrics SD10, SD12 being composed of high-k dielectric materials, the doping in the mesa region can be increased to reduce the on-resistance (Rsp,on). In some implementation, the high-k dielectric portion HK10 can be extended to the gate electrode 120 to further reduce junction electric field as shown and described in connection with FIG. 2C.

Figure 2C:
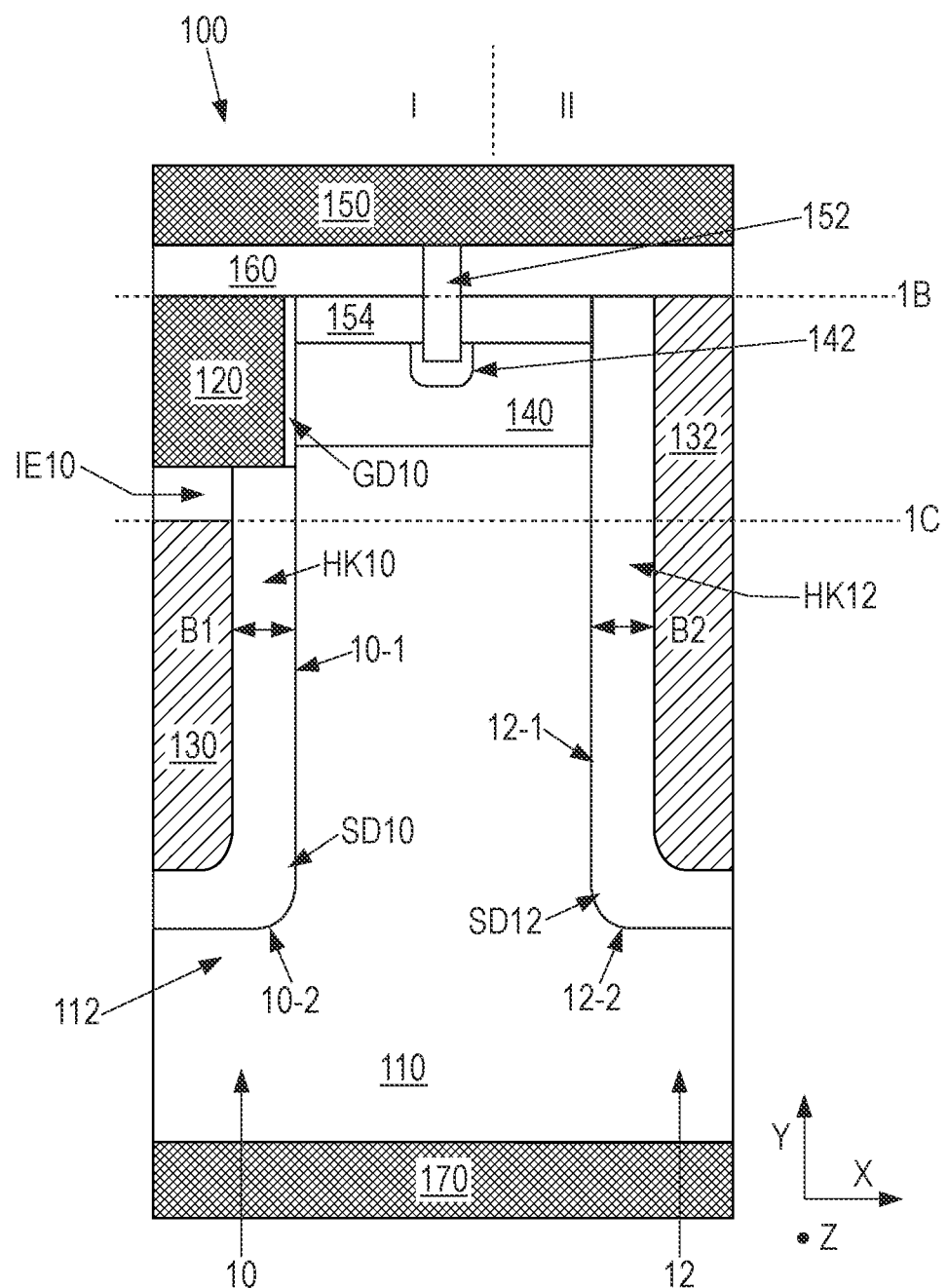

FIG. 2C illustrates a variation of the semiconductor device 100 shown in FIG. 1. The variation in FIG. 2C has the same termination region II configuration as that shown in FIG. 2B and many features of the active region I are similar to those in FIG. 2B. In this implementation, the low-k dielectric portion LK10 is entirely excluded from the active shield dielectric SD10. However, the high-k dielectric portion HK10 has a height that extends to a bottom of the gate electrode 120 (e.g., beyond a top of the active shield electrode 130 (at line 1C) and bottom of the inter-electrode dielectric IE10). The high-k dielectric portion HK10 contacts a bottom of the gate dielectric GD10. The high-k dielectric portion HK10 has a height that extends to a top of the inter-electrode dielectric IE10. The high-k dielectric portion HK10 has a width B1 that is uniform between the active shield electrode 130 and the sidewall 10-2 up to contacting both the gate electrode 120 and the gate dielectric GD10. In some implementations, the high-k dielectric portion HK10 between the active shield electrode 130 and the sidewall 10-2 can be the same width as the width B1. In some implementation, the high-k dielectric portion HK10 between the active shield electrode 130 and the sidewall 10-2 can be the smaller or larger compared to the width B1. The high-k dielectric portion HK10 makes up an entirety of the active shield dielectric SD10 and the active shield electrode 130 is insulated from the semiconductor region 112 (or substrate 110) via the high-k dielectric portion HK10. In this implementation, the high-k dielectric portion HK10 is extended to the gate electrode 120 to further reduce junction electric field.

Figure 2D:
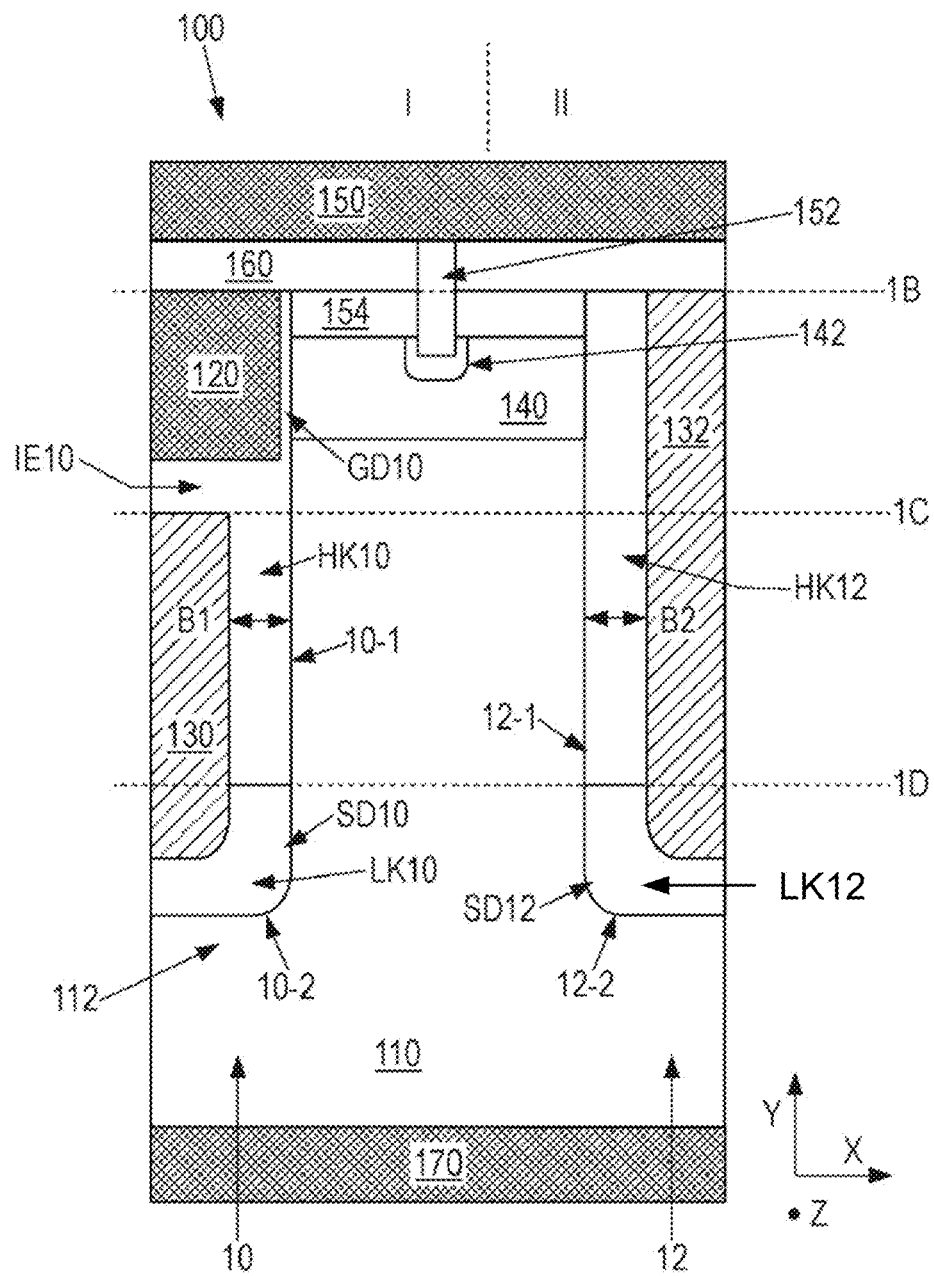

FIG. 2D illustrates a variation of the semiconductor device 100 shown in FIG. 1. In this implementation, the high-k dielectric portion HK10 is above (e.g., vertically above) the low-k dielectric portion LK10. Accordingly, the low-k dielectric portion LK10 has a portion disposed along the bottom surface 10-2 of the active trench 10. The high-k dielectric portion HK10 is disposed between the low-k dielectric portion LK10 and the inter-electrode dielectric IE10. The high-k dielectric portion HK10 has an interface with the low-k dielectric portion LK10 at dashed line 1D. The low-k dielectric portion LK10 of the active shield dielectric SD10 has a width B1 that extends from the active shield electrode 130 to the sidewall 10-1 of the active trench 10. The high-k dielectric portion HK10 contacts (or extends vertically to) the inter-electrode dielectric IE10. The high-k dielectric portion HK10 has a height that extends to a top of the active shield electrode 130. In some implementations, the inter-electrode dielectric IE10 can be, or can include, a high-k dielectric material.

In this implementation, the high-k dielectric portion HK12 is above (e.g., vertically above) the low-k dielectric portion LK12. Accordingly, the low-k dielectric portion LK12 has a portion disposed along the bottom surface 12-2 of the termination trench 12. The high-k dielectric portion HK12 is disposed between the low-k dielectric portion LK12 and the dielectric 160. In this implementation, the low-k dielectric portion LK12 of the termination shield dielectric SD12 has a width B2 that extends from the termination shield electrode 132 to the sidewall 12-1 of the termination trench 12. The high-k dielectric portion HK12 contacts (or extends vertically to) the dielectric 160. The high-k dielectric portion HK12 has a height that extends to a top of the termination shield electrode 132. The high-k dielectric portion HK12 has an interface with the low-k dielectric portion LK12 at dashed line 1D.

In some implementations, the high-k dielectric portions HK10, HK12 can be deposited at bottom of the respective trenches 10, 12 (with increased doping near trench bottom) to increase high voltage capacitance (e.g., output capacitance) at the bottoms of the trenches 10, 12. This can result in, for example, more desirable (e.g., softer or relaxed) reverse recovery characteristics.

Figure 2E:
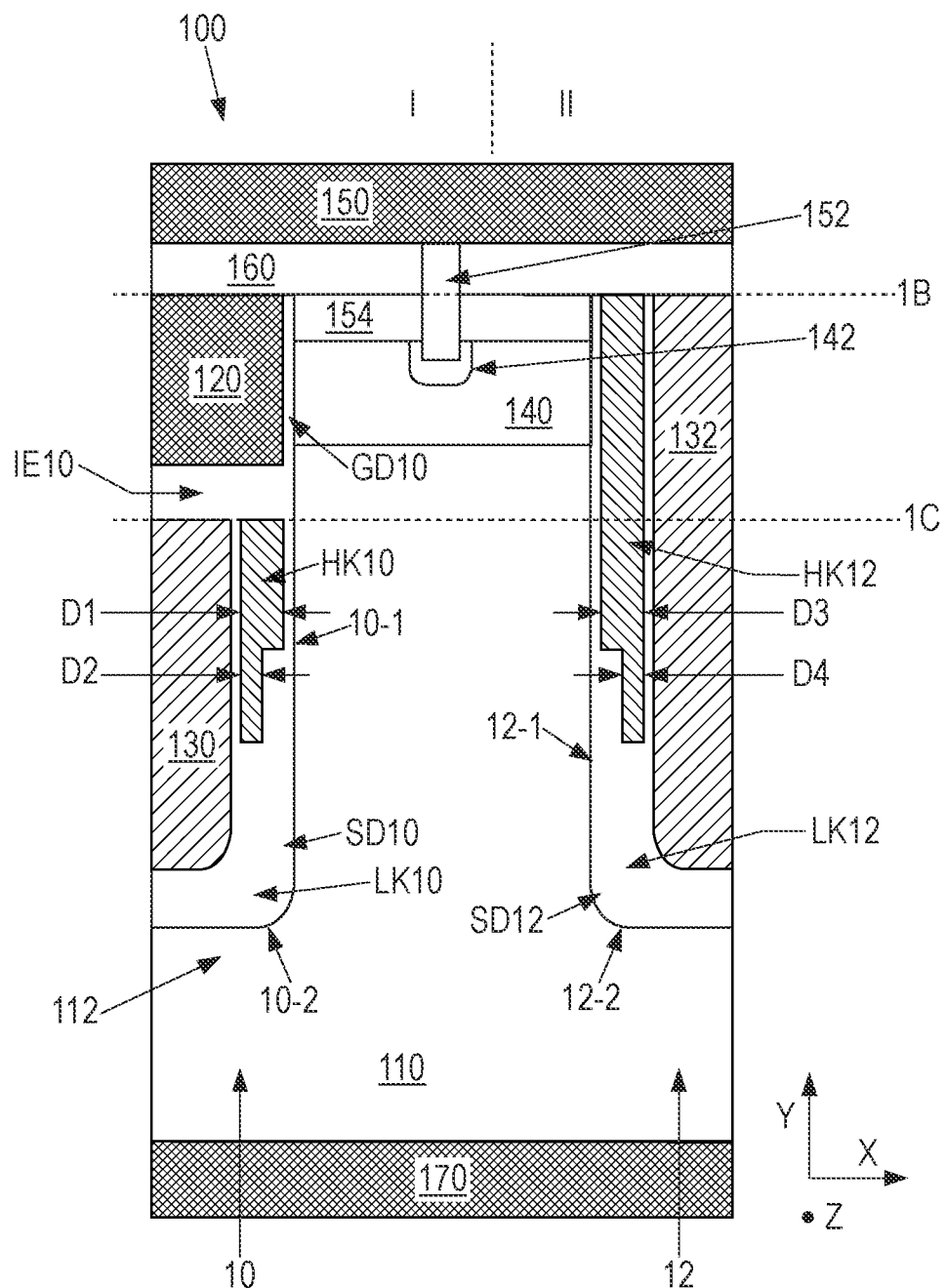

FIG. 2E illustrates a variation of the semiconductor device 100 shown in FIG. 1. In this implementation, the low-k dielectric portion LK10 and/or LK12 can have a non-uniform width. The non-uniform width can be defined along the respective sidewalls 10-1, 12-1 to obtain a desired breakdown voltage and/or output capacitance ($C_{oss}$) characteristic.

In this implementation, the high-k dielectric portion HK10 of the active shield dielectric SD10 has a non-uniform width that changes from width D1 to width D2. The low-k dielectric portion LK10 has a step or decrease in thickness that is on a side along the sidewall 10-1, while a side along the active shield electrode 130 is straight or does not have a step or change. Also, the high-k dielectric portion HK10 does not contact the active shield electrode 130 and/or the sidewall 10-1 of the active trench 10.

Also, in this implementation, the high-k dielectric portion HK12 of the termination shield dielectric SD12 has a non-uniform width that changes from width D3 to width D4. The high-k dielectric portion HK12 does not contact the termination shield electrode 132 and/or the sidewall 12-1 of the termination trench 10. The low-k dielectric portion LK12 has a step or decrease in thickness that is on a side along the sidewall 12-1, while a side along the termination shield electrode 132 is straight or does not have a step or change.

Figure 2F:
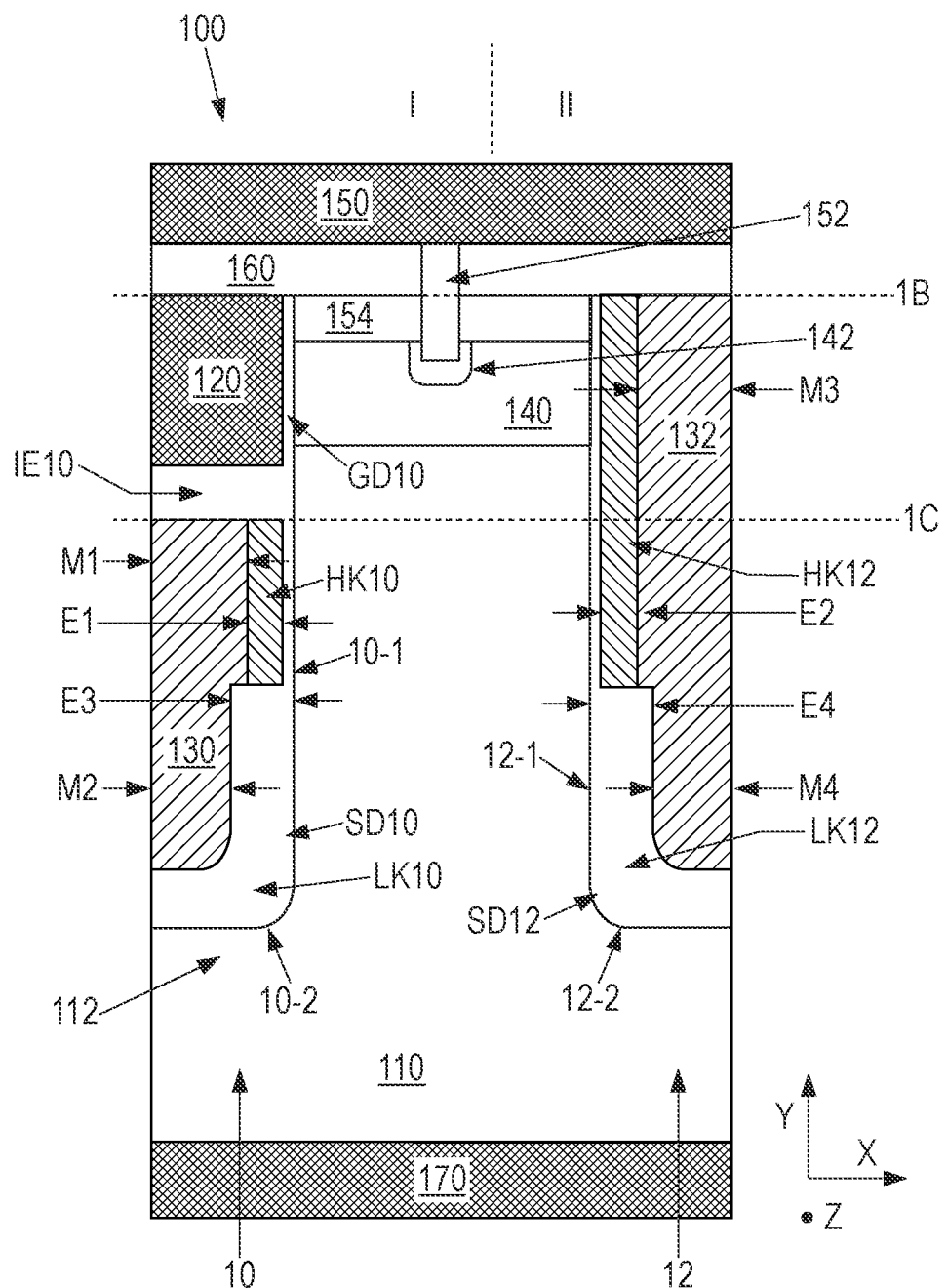

FIG. 2F illustrates a variation of the semiconductor device 100 shown in FIG. 1. In this implementation, the active shield electrode 130 and the termination shield electrode 132 have a wider upper portion than lower portion. The high-k dielectric portions HK10, HK12 are combined with these step-shaped shield electrodes.

In this implementation, the high-k dielectric portion HK10 of the active shield dielectric SD10 has a width E1 smaller than a width E3 of the low-k dielectric portion LK10 (that is in contact with the high-k dielectric portion HK10). In this implementation, the high-k dielectric portion HK10 and the low-k dielectric portion LK10 both are in contact with the active shield electrode 130. A width M1 of the active shield electrode 130 lateral to (to the left of) the high-k dielectric portion HK10 is wider than a width M2 of the active shield electrode 130 lateral to (to the left of) the low-k dielectric portion LK10. A portion of the low-k dielectric portion LK10 is disposed between high-k dielectric portion HK10 and the sidewall 10-1 (and substrate 110).

Also, in this implementation, the high-k dielectric portion HK12 of the termination shield dielectric SD12 has a width E2 smaller than a width E4 of the low-k dielectric portion LK12 (that is in contact with the high-k dielectric portion HK12). In this implementation, the high-k dielectric portion HK12 and the low-k dielectric portion LK12 both are in contact with the termination shield electrode 132. A width M3 of the termination shield electrode 132 lateral to (to the right of) the high-k dielectric portion HK12 is wider than a width M4 of the termination shield electrode 132 lateral to (to the right of) the low-k dielectric portion LK12. A portion of the low-k dielectric portion LK12 is disposed between high-k dielectric portion HK12 and the sidewall 12-1 (and substrate 110).

As shown in FIG. 2F, the active shield electrode 130 and/or the termination shield electrode 132 can have a stepped profile. In some implementations, the active shield electrode 130 and/or the termination shield electrode 132 can have a tapered profile.

Figure 2G:
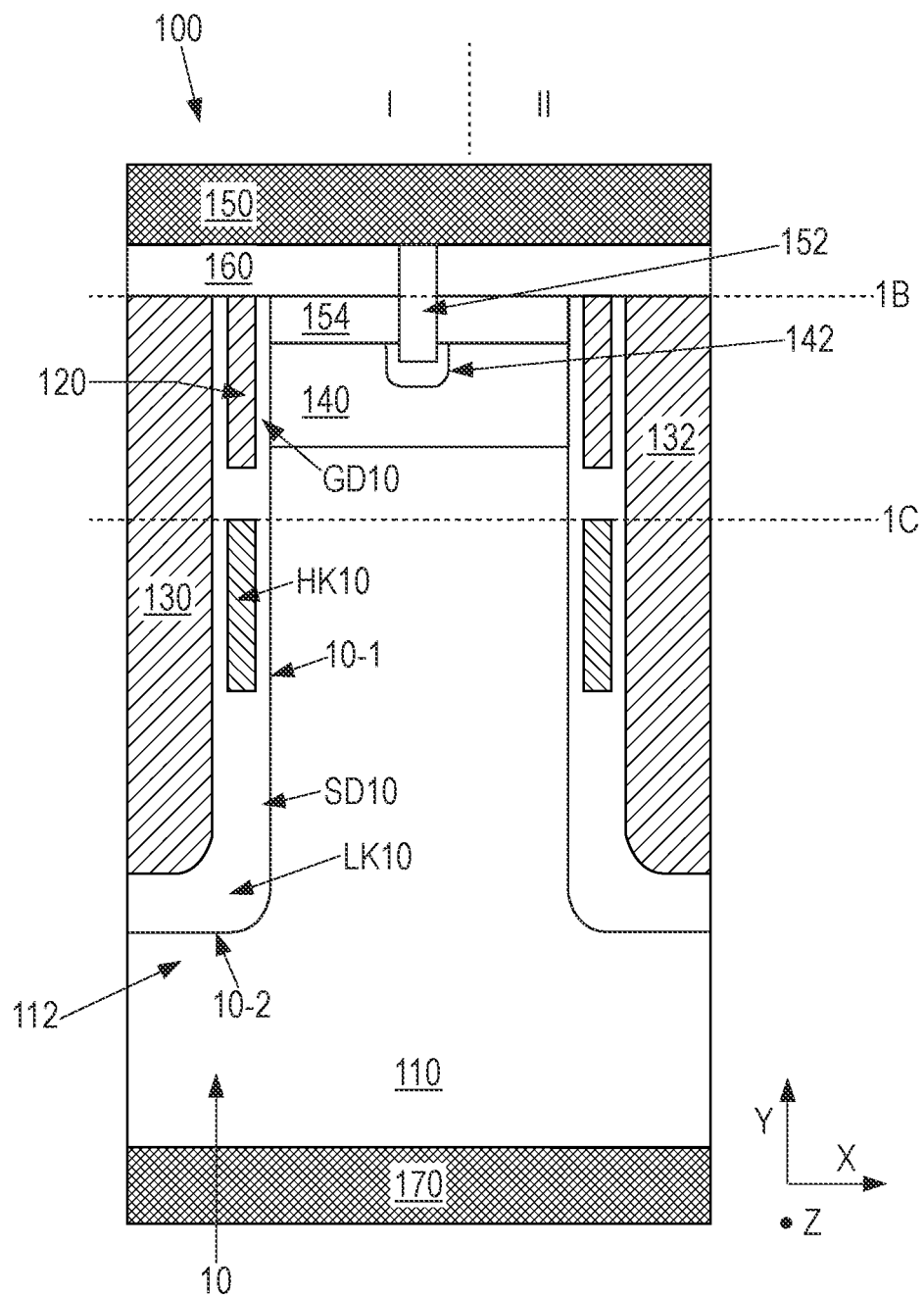

FIG. 2G illustrates a variation of the semiconductor device 100 shown in FIG. 1. In this implementation, the active shield dielectric SD10 includes the low-k dielectric portion LK10 and a high-k dielectric portion HK10. The low-k dielectric portion LK10 is in contact with the high-k dielectric portion HK10. In this example implementation, the high-k dielectric portion HK10 is included in, or surrounded by the low-k dielectric portion LK10.

The shield electrode 130 in this implementation is flanked by the gate electrode 120 (on both sides of the shield electrode 130 although only one side is shown). The shield electrode 130 is insulated from the source 150 by the dielectric 160. Although not shown in this figure, in some implementations, the shield electrode 130 can be connected (e.g., electrically connected) to the source 150. For example, the shield electrode 130 can be connected to the source 150 through the dielectric 160 (through a metal layer, via, and/or a metal runner) at a location along (along the z-direction) within the trench 10.

The gate electrode 120 has a top end or surface at a same height as the termination shield electrode 132 as shown by dashed line 1B. The top end of the high-k dielectric portion HK10 in the active trench 10 below the gate electrode 120 and is at the height shown by dashed line 1C.

In this implementation, the gate electrode 120 has a width narrower than a width of the high-k dielectric portion HK10. In some implementations, the gate electrode 120 has a width greater than or the same as the width of the high-k dielectric portion HK10. Any of the shield dielectric SD10 configurations shown in FIGS. 1 through 2F can be applied to this implementation.

Figure 2H:
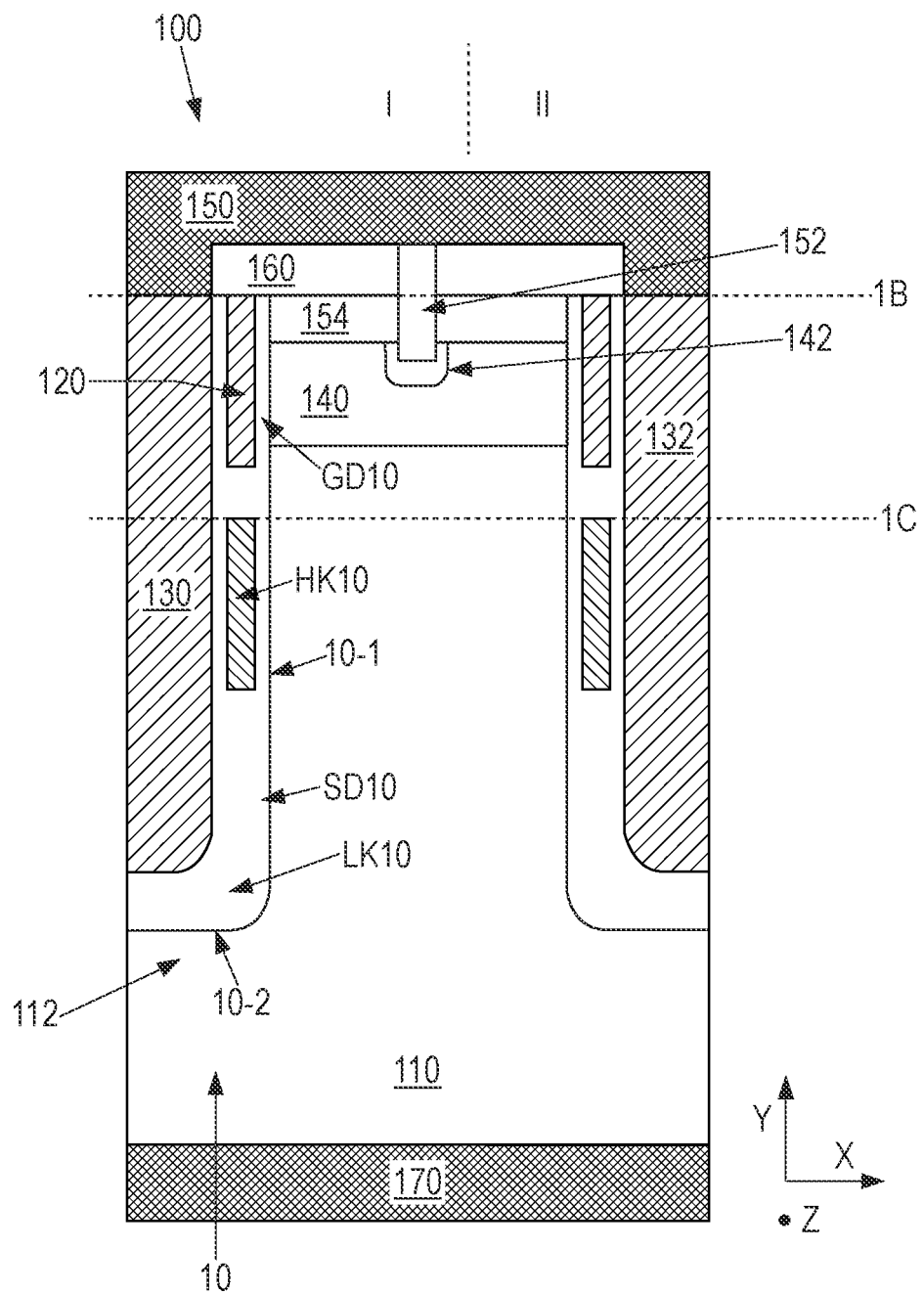

FIG. 2H illustrates a variation of the semiconductor device 100 shown in FIG. 2G. In this implementation, the shield electrode 130 is electrically coupled to the source 150 through the dielectric 160.

Any of the elements shown in FIGS. 1 through 2H can be combined and/or interchanged. For example, any of the active regions I shown in FIGS. 1 through 2H can be used with any of the termination regions II shown in FIGS. 1 through 2H.

Figure 3:
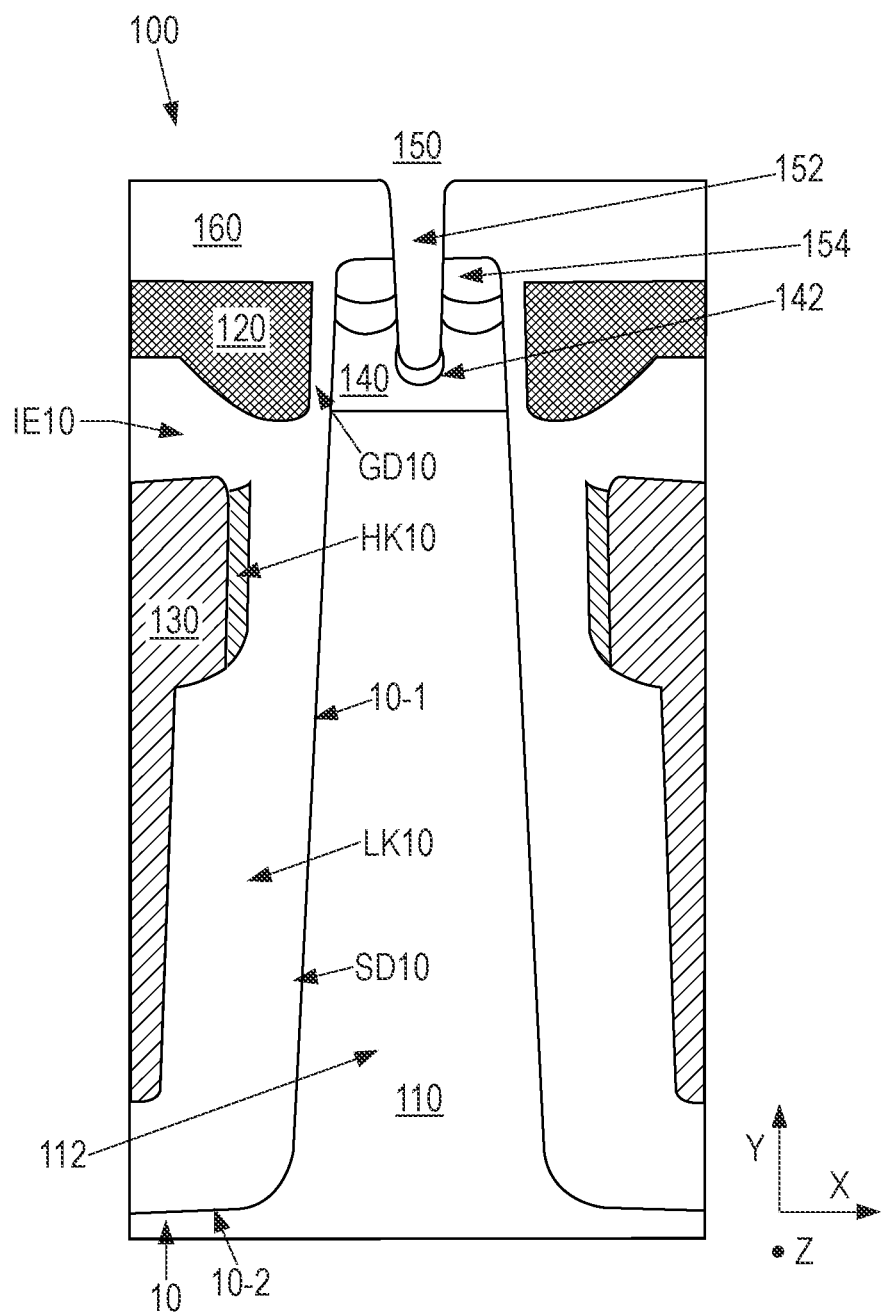
FIG. 3 illustrates a variation of active devices of the semiconductor device shown in FIG. 1.

FIG. 3 illustrates a variation of active devices of the semiconductor device 100 shown in FIG. 1. In this implementation, the active shield electrode 130 has a wider upper portion than lower portion. The high-k dielectric portions HK10 is combined with the step-shaped shield electrode. Although not shown, a corresponding termination structure can have a step-shaped shield electrode.

FIGS. 4A through 4I illustrate a method for making at least some of the implementations described herein. For example, the method shown in FIGS. 4A through 4I can be used to produce the implementation shown in FIG. 1.

Figure 4A:
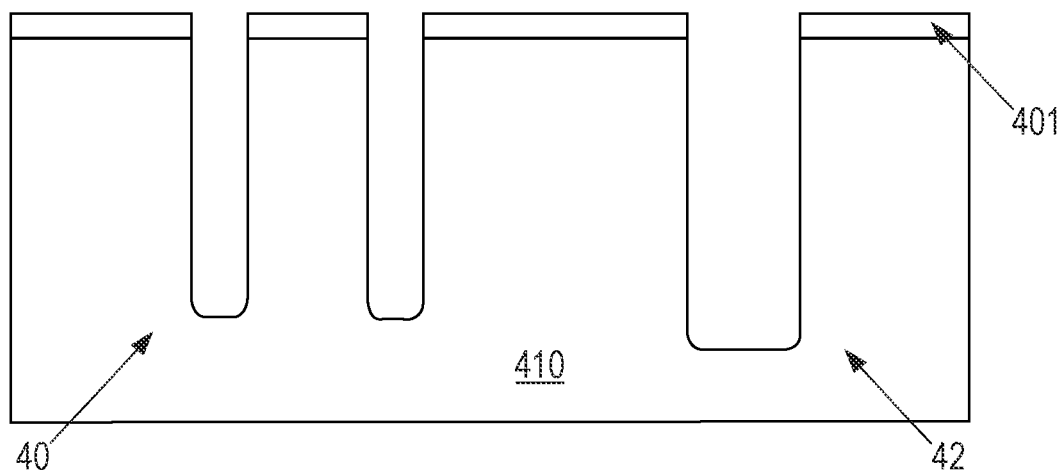
FIGS. 4A through 4I illustrate a method for making at least some of the implementations described herein.
Figure 4B:
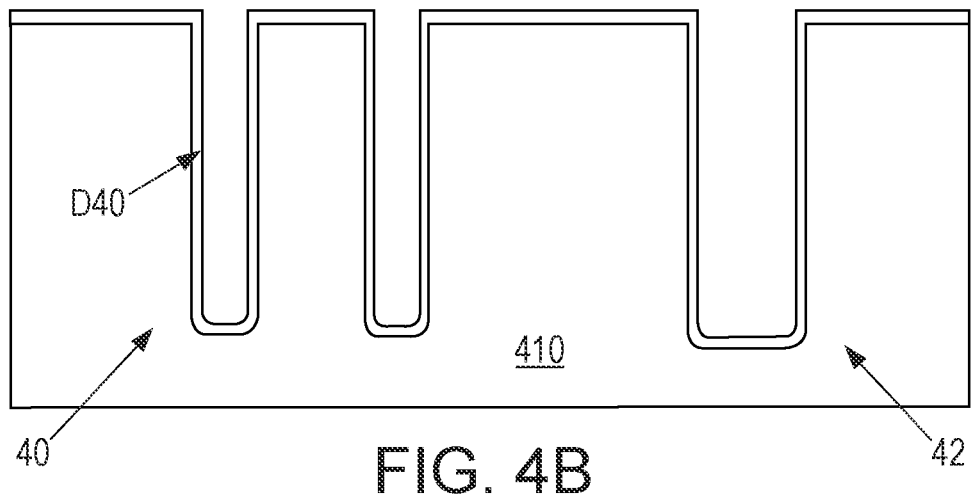

As shown in FIG. 4A, an active trench 40 and a termination trench 42 (collectively referred to as trenches) are formed (e.g., etched) within a semiconductor region of a substrate 410 using a photolithography process including a mask 401 (e.g., hardmask). After the formation of the trenches 40, 42, a dielectric D40 can be formed as shown in FIG. 4B. The dielectric D40 can be used to form the gate dielectric (e.g., gate oxide, 450 Angstrom gate oxide) in the active trench 40. In some implementations, a sacrificial oxide and/or oxide wet strip can be used during formation of the dielectric D40.

Figure 4C:
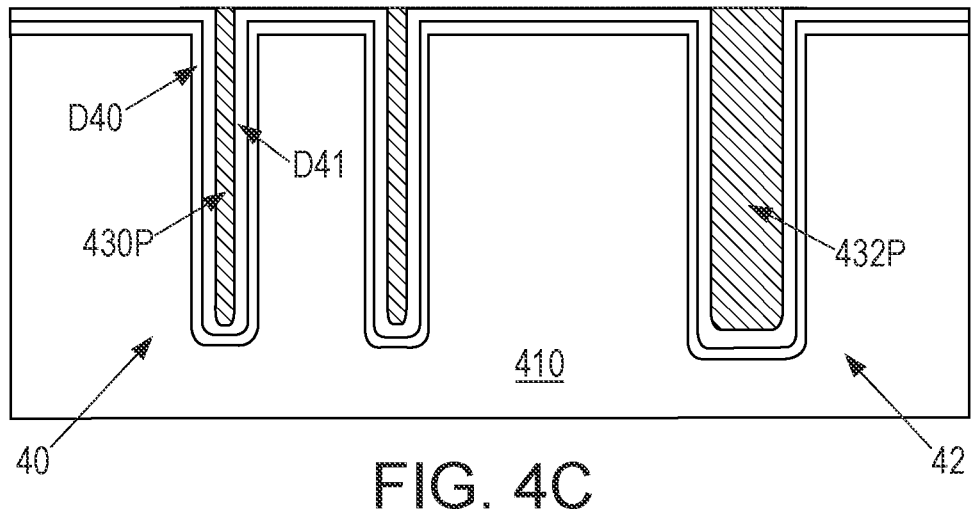

FIG. 4C illustrates formation of dielectric D41 that can be used to form at least a portion of a shield dielectric in the active trench 40 and the termination trench 42. FIG. 4C also illustrates polysilicon deposition to form an active shield electrode precursor 430P and a termination shield electrode precursor 432P.

Figure 4D:
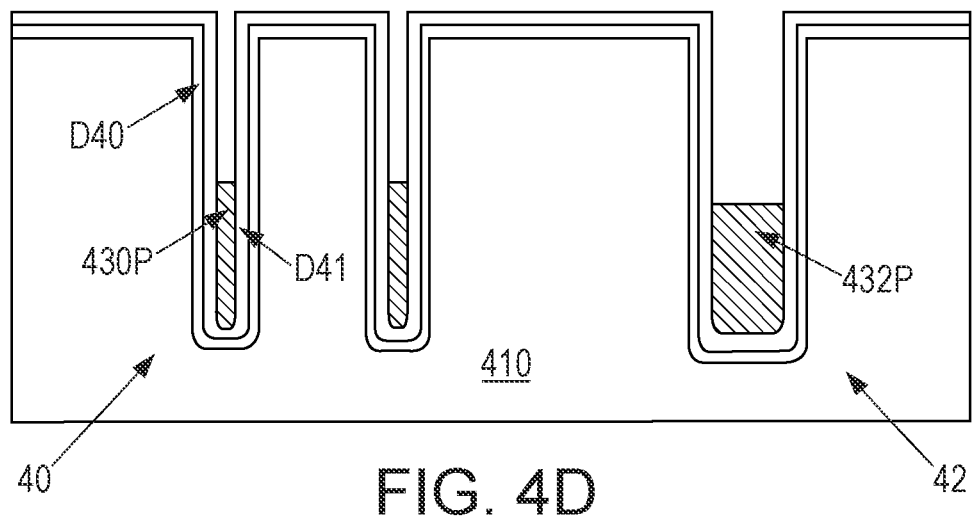

FIG. 4D illustrates etching (e.g., recess etching) of the active shield electrode precursor 430P and termination shield electrode precursor 432P.

Figure 4E:
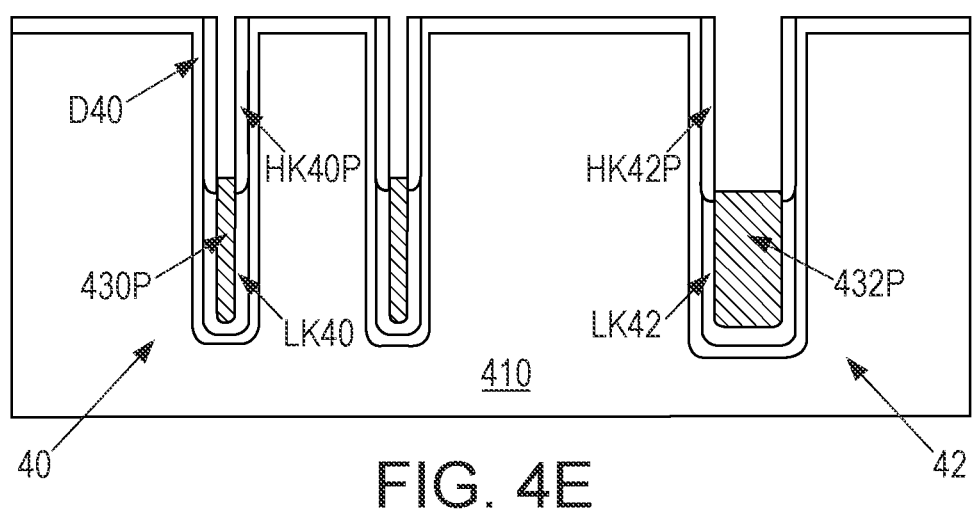

FIG. 4E illustrates formation of a high-k shield dielectric precursor HK40P in the active trench 40 and a high-k shield dielectric precursor HK42P in the termination trench 42. As shown in FIG. 4E, the combination of the dielectric D40 and the dielectric D41 becomes the low-K dielectric LK40 in the active trench 40 and the low-k dielectric LK42 in the termination trench 42. The high-k shield dielectric precursors HK40P, HK42P can be formed using a nitride liner deposition and a nitride spacer etch.

Figure 4F:
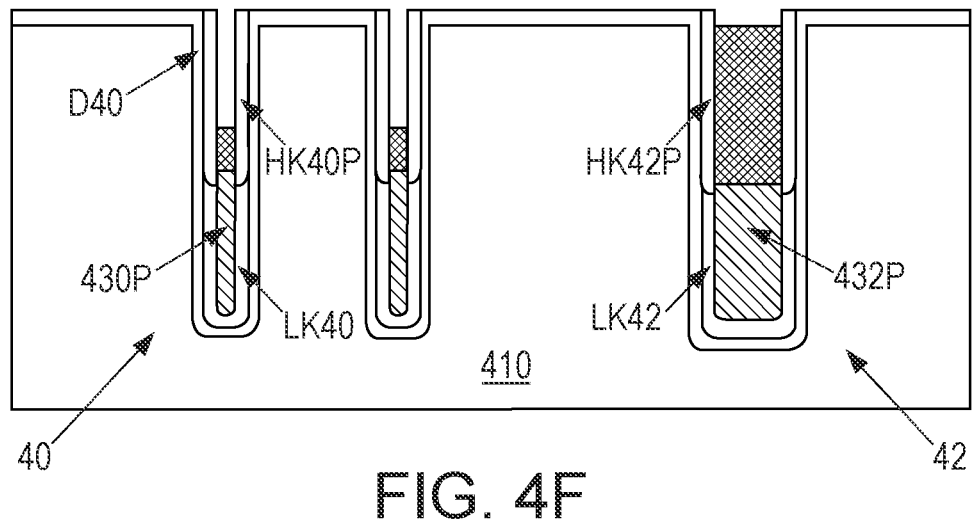

As shown in FIG. 4F, additional polysilicon is deposited within the active trench 40 on the active shield electrode precursor 430P and in the termination trench 42 on the termination shield electrode precursor 432P. The active shield electrode precursor 430P and the termination shield electrode precursor 432P can be modified as shown in FIG. 4F using a doped polysilicon fill, chemical mechanical polish, a field plate photolithography process, a polysilicon recess etch, and/or a resist strip process.

Figure 4G:
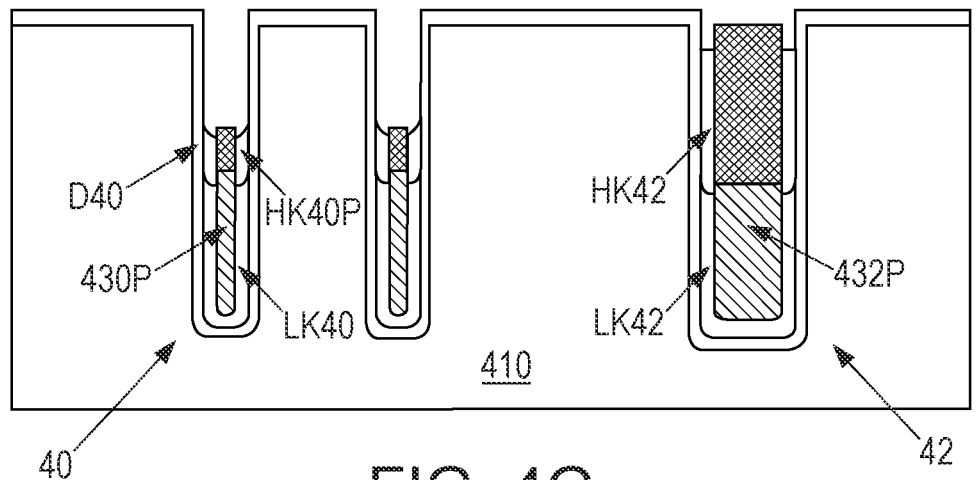

FIG. 4G illustrates etching of the high-k shield dielectric precursor HK40P in the active trench 40 and the high-k shield dielectric precursor HK42P in the termination trench 42 to form the high-k shield dielectric HK40 and the high-k shield dielectric HK42.

Figure 4H:
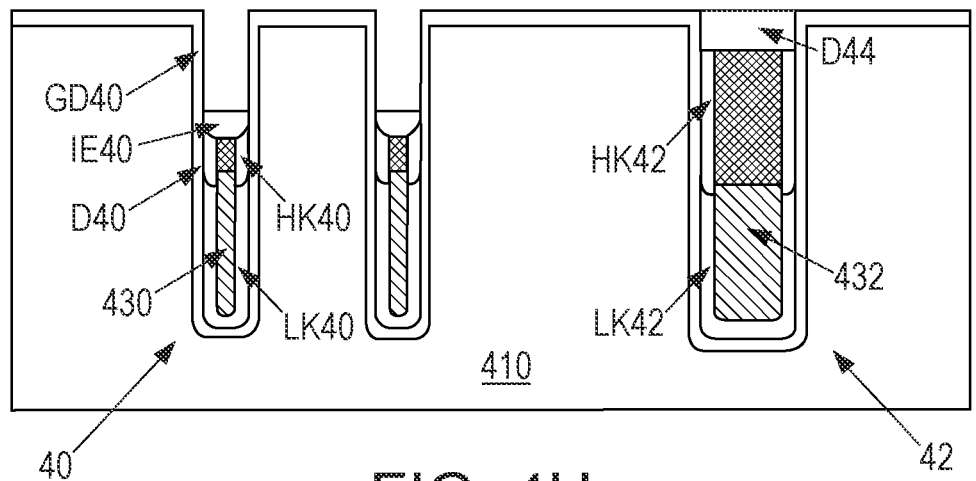

As shown in FIG. 4H, the active shield electrode precursor 430P and the termination shield electrode precursor 432P are modified (e.g., recessed) to define the active shield electrode 430 and the termination shield electrode 432. A gate dielectric GD40 (e.g., a thermal oxide) is formed within the active trench 40. Also, a dielectric is formed within the active trench 40 to define an interelectrode dielectric IE40. An dielectric D44 is also formed above the termination trench.

Figure 4I:
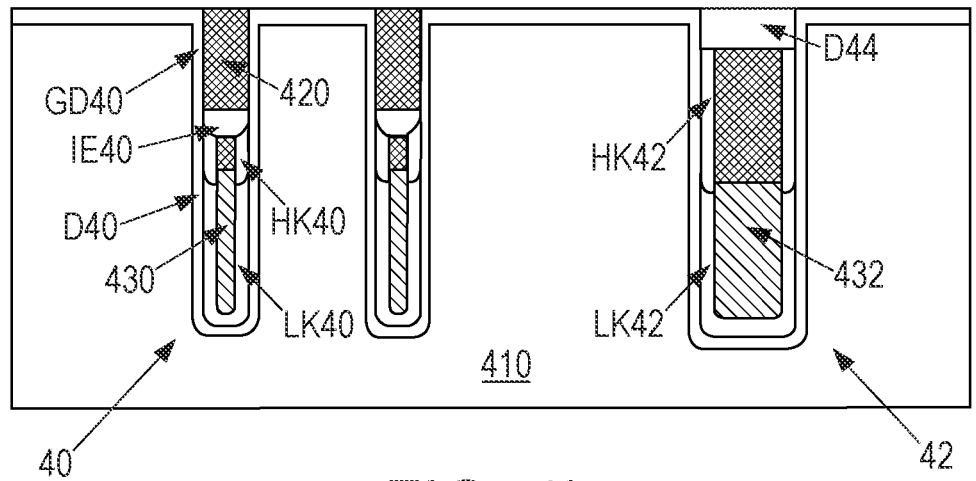

FIG. 4I illustrates formation of a gate electrode 420 in the active trench 40.

Although not shown in FIG. 4A through 4I, one or more doped regions can be formed as shown in any of FIGS. 1 through 3. For example, a well region, a source region, and/or so forth can be formed in the device shown in FIGS. 4A through 4I.

Figure 5:
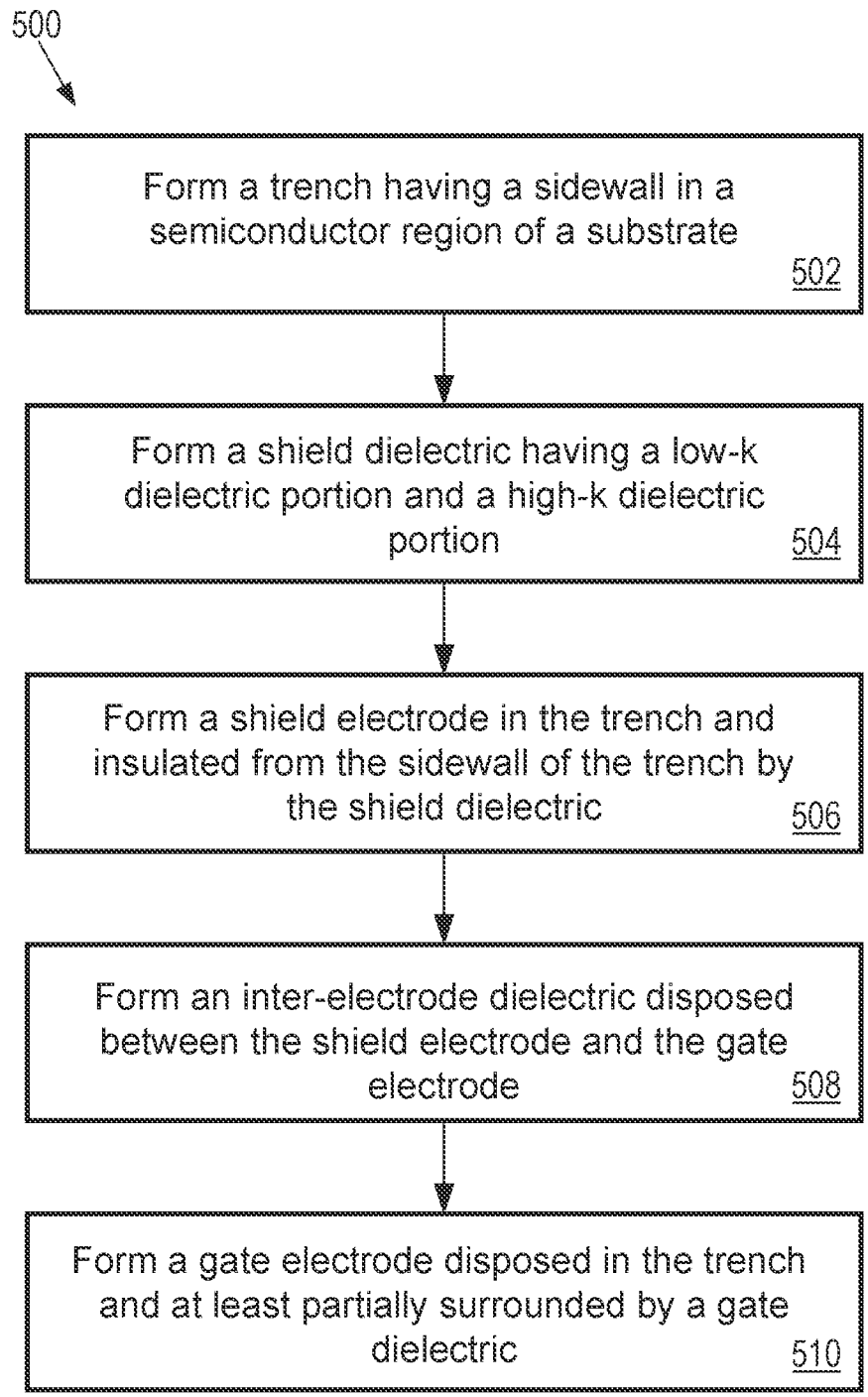
FIG. 5 illustrates a method for making at least some of the implementations described herein.
Figure 6A:
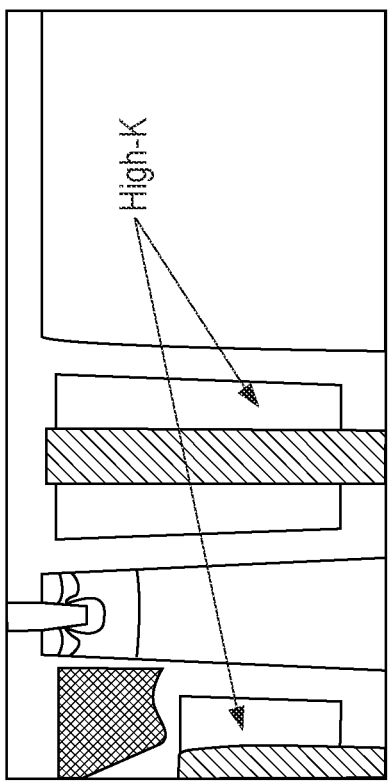
FIGS. 6A through 6D illustrate the effects of the high-k dielectric portions in the shields of MOSFET devices described herein.
Figure 6B:
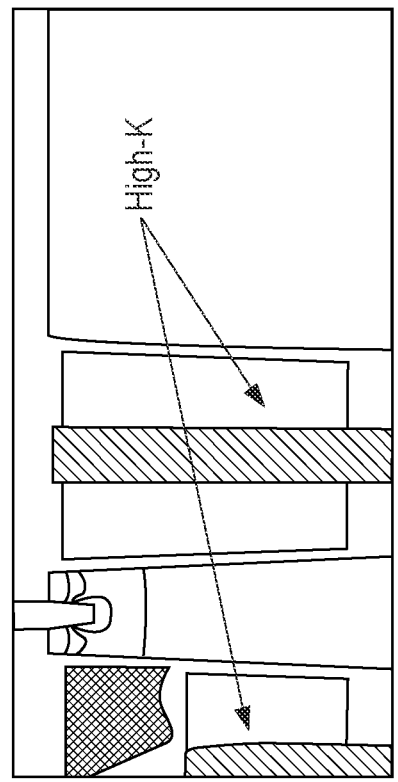
Figure 6C:
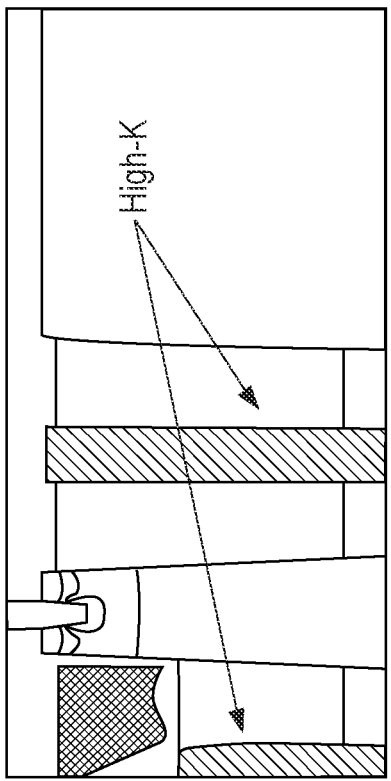
Figure 6D:
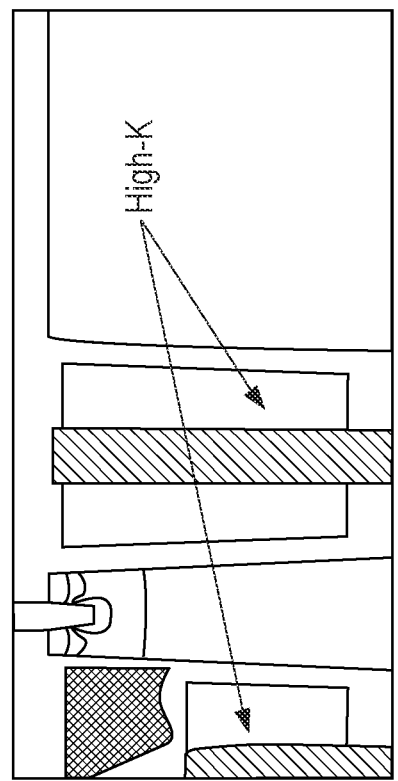

FIG. 5 illustrates a method for making at least some of the implementations described herein. As shown in FIG. 5, the method includes forming a trench having a sidewall in a semiconductor region of a substrate (bock 502). The method also includes forming a shield dielectric having a low-k dielectric portion and a high-k dielectric portion (block 504). In some implementations, the low k-dielectric portion can include multiple dielectrics formed using multiple dielectric formation processes. The method can include forming a shield electrode in the trench and insulated from the sidewall of the trench by the shield dielectric (block 506), and forming an inter-electrode dielectric disposed between the shield electrode and the gate electrode (block 508). The method can include forming a gate electrode disposed in the trench and at least partially surrounded by a gate dielectric (block 510).

In some implementations, the high-k dielectric portion can be in contact with at least one of the shield electrode or the sidewall of the trench. In some implementations, the high-k dielectric portion can be insulated from the sidewall by a least a portion of the low-k dielectric portion.

FIGS. 6A through 6D illustrate the effects of the high-k dielectric portions in the shields of MOSFET devices described herein. FIGS. 6A through 6D illustrate examples Z1 through Z4, respectively with different types of high-k dielectrics. For example, Z1 can have a high-k dielectric of U4 Å and $\varepsilon_{hk}$=V1 and no low-k dielectric, Z2 can have a high-k dielectric of U1 Å and $\varepsilon_{hk}$=V4 and W4 Å of low-k dielectric, Z3 can have a high-k dielectric of U2 Å and $\varepsilon_{hk}$=V3 and W3 Å of low-k dielectric, and Z4 can have a high-k dielectric of U3 Å and $\varepsilon_{hk}$=V2 and W2 Å of low-k dielectric. In this example implementation, U4>U3>U2>U1, V4>V3>V2>V1, and W4>W3>W2.

Figure 7:
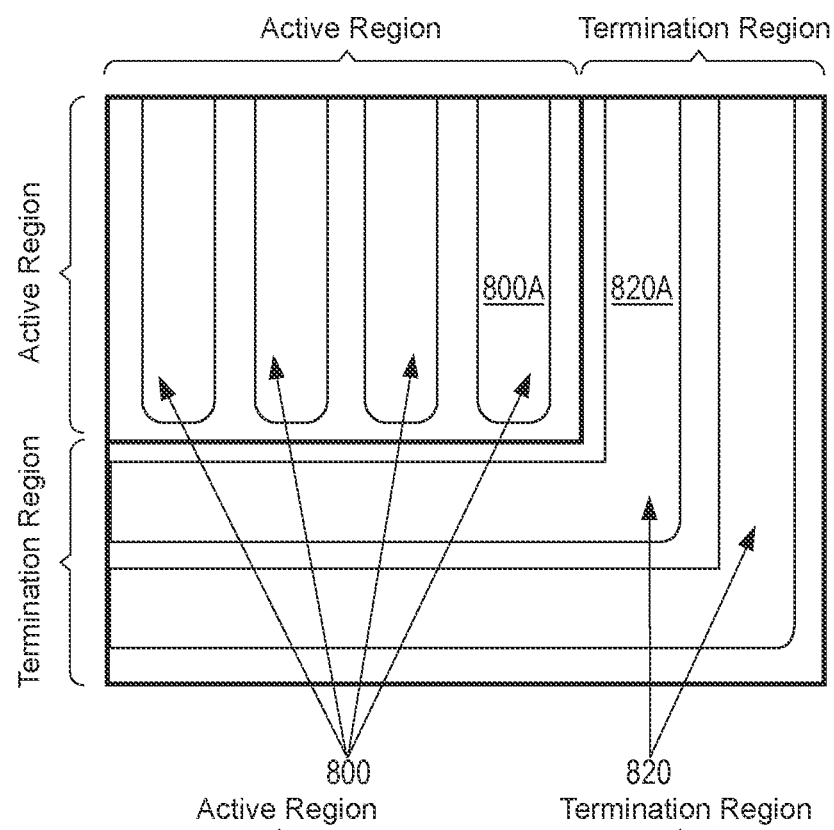
FIGS. 7 and 8 are diagrams that illustrate top views of layouts of active trenches and termination trenches.
Figure 8:
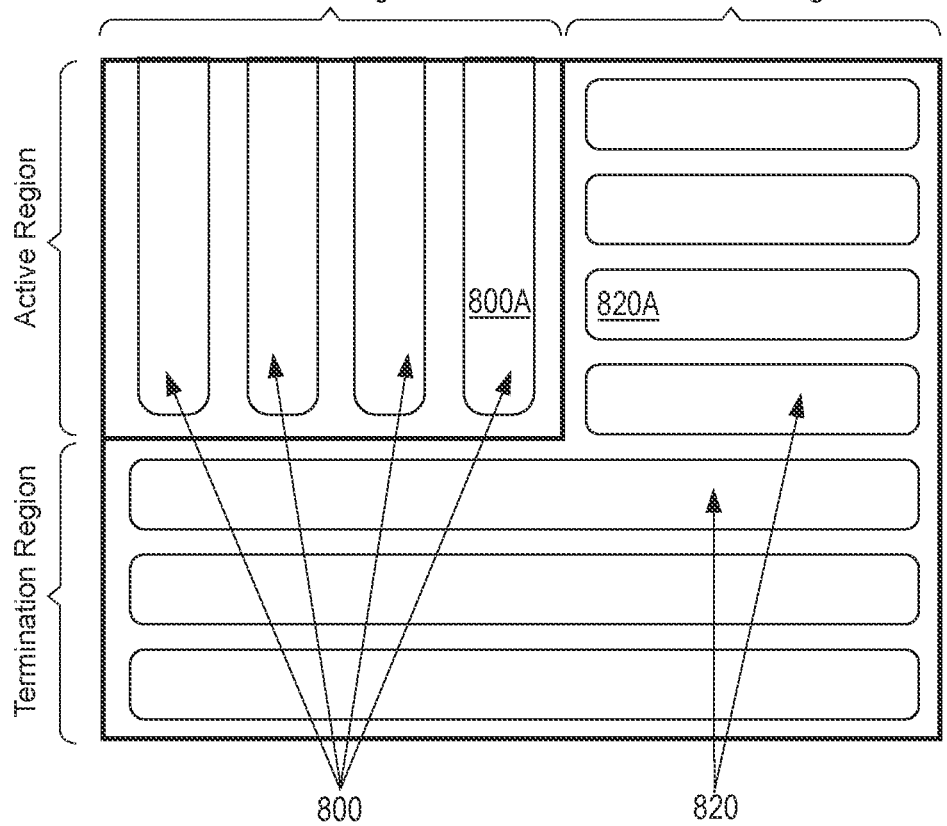

FIGS. 7 and 8 are diagrams that illustrate top views of layouts of active trenches 800 and termination trenches 820. Many of the structures illustrated herein can correspond with active trench 800A and termination trench 820A. For example, the active trench 10 shown in FIG. 1 can correspond with active trench 800A and the termination trench 12 shown in FIG. 1 can correspond with termination trench 820A. In FIG. 7, the termination trenches 820 can define perimeter trenches around the parallel active trenches 800. A first portion of the termination trenches 820 are parallel to the parallel active trenches 800, and a second portion of the termination trenches 820 are orthogonal to the parallel active trenches 800. In FIG. 8, the termination trenches 820 define parallel trenches aligned orthogonal to the parallel active trenches 800.

In some implementations of FIGS. 7 and/or 8, the active region can use conventional shield dielectric devices and the termination region can use any of the high-k dielectric termination structures described herein. In some implementations of FIGS. 7 and/or 8, the active region can use a first type of high-k dielectric structure as described herein and the termination region can use a second type of high-k dielectric termination structure as described herein.

In some implementations of FIGS. 7 and/or 8, the breakdown voltage in the termination region can be greater than the breakdown voltage in the active region. In some implementations of FIGS. 7 and/or 8, the termination region mesa regions can be reduced in size (e.g., width) to support a breakdown voltage similar to that in the active region so that the area of the termination region can be reduced.

In at least one aspect, an apparatus can include a substrate having a semiconductor region, and a termination trench defined in the semiconductor region and having a sidewall. The apparatus can include a termination shield electrode disposed in the termination trench and insulated from the sidewall of the termination trench by a termination shield dielectric. The termination shield dielectric can include a low-k dielectric portion and a high-k dielectric portion.

In at least another aspect, an apparatus can include a substrate having a semiconductor region, and a termination trench defined in the semiconductor region and having a sidewall. The apparatus can include a termination shield electrode disposed in the termination trench and insulated from the sidewall of the termination trench by a high-k shield dielectric.

Figure 9:
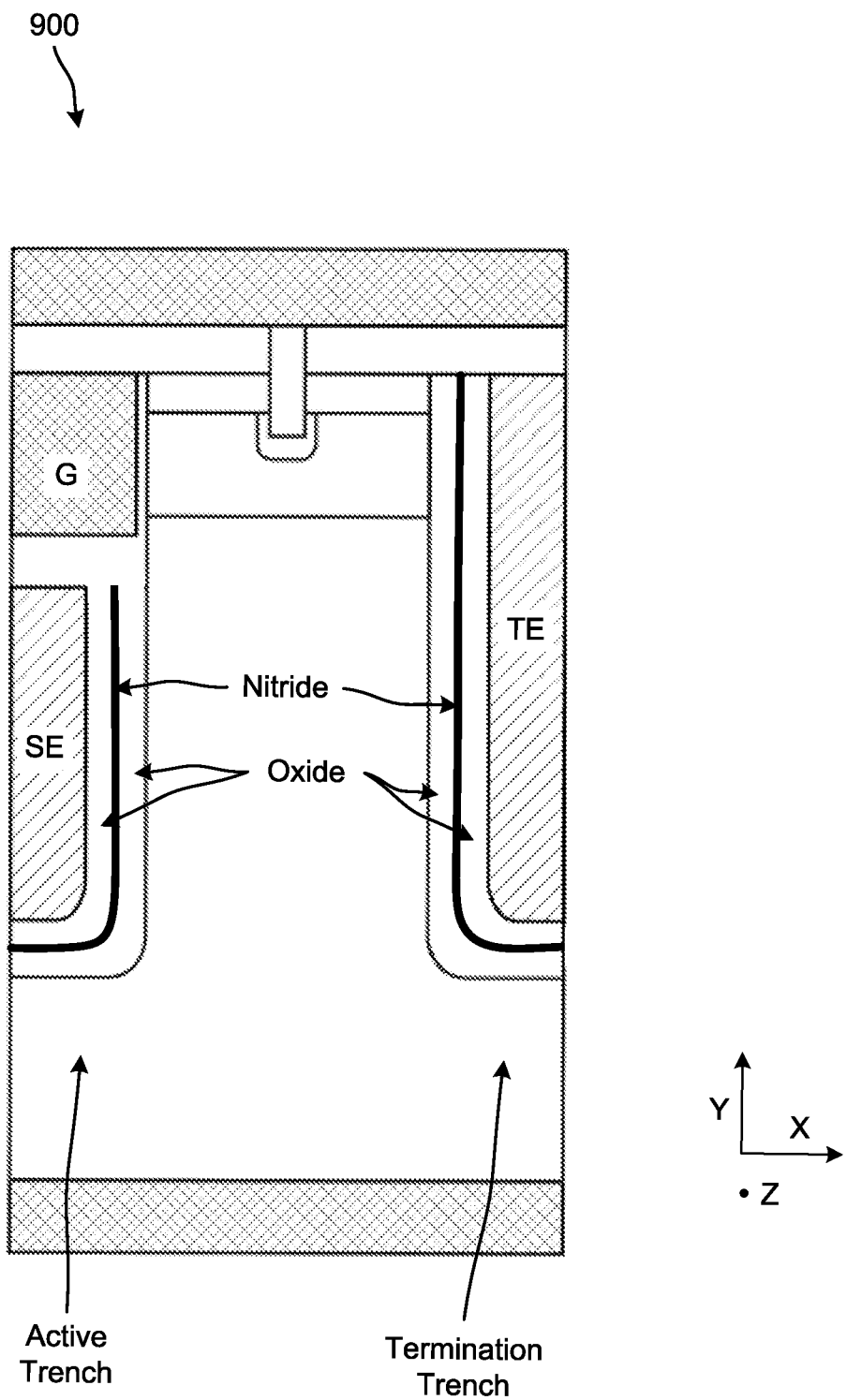
FIG. 9 is a prior art figure that illustrates an active trench and a termination trench.

FIG. 9 is a prior art figure that illustrates a device 900 that includes an active trench and a termination trench. As shown in FIG. 9, the active trench includes a shield electrode SE and a gate electrode G, and the termination trench includes a termination electrode TE. The oxide in the active trench is divided by a thin layer of nitride, and the oxide in the termination trench is divided by the thin layer of nitride.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a substrate having a semiconductor region;
a trench defined in the semiconductor region and having a sidewall;
a shield electrode disposed in the trench and insulated from the sidewall of the trench by a shield dielectric, the shield dielectric having a low-k dielectric portion and a high-k dielectric portion;
a gate electrode disposed in the trench and at least partially surrounded by a gate dielectric; and
an inter-electrode dielectric disposed between the shield electrode and the gate electrode, the high-k dielectric portion being insulated from the sidewall by at least a portion of the low-k dielectric portion, the high-k dielectric portion being in contact with the shield electrode.

2. The apparatus of claim 1, wherein the shield electrode has a width across a top portion wider than a width across a bottom portion.

3. The apparatus of claim 1, wherein the shield electrode has a stepped shape.

4. The apparatus of claim 1, wherein the high-k dielectric portion has a width across a top portion wider than a width across a bottom portion.

5. The apparatus of claim 1, wherein the high-k dielectric portion has a stepped shape.

6. The apparatus of claim 1, wherein the high-k dielectric portion has a portion disposed between a bottom of the shield electrode and a bottom surface of the trench.

7. The apparatus of claim 1, wherein the low-k dielectric portion is in contact with a bottom of the shield electrode.

8. The apparatus of claim 1, wherein at least a portion of or an entirety of the inter-electrode dielectric is made of a high-k dielectric material.

9. The apparatus of claim 1, wherein the shield electrode has a width greater than a width of the high-k dielectric portion.

10. The apparatus of claim 1, wherein the shield electrode has a top surface at a same height as a top surface of the high-k dielectric portion.

11. The apparatus of claim 1, wherein the shield electrode has a step aligned with a bottom surface of the high-k dielectric portion.

12. An apparatus, comprising:
 a substrate having a semiconductor region;
 a trench defined in the semiconductor region and having a sidewall;
 a shield electrode disposed in the trench and insulated from the sidewall of the trench by at least a high-k shield dielectric;
 a gate electrode disposed in the trench and at least partially surrounded by a gate dielectric; and
 an inter-electrode dielectric disposed between the shield electrode and the gate electrode the high-k shield dielectric being insulated from the sidewall by at least a portion of a low-k dielectric portion, the high-k shield dielectric being in contact with the shield electrode.

13. The apparatus of claim 12, wherein the high-k shield dielectric has a first portion disposed between a bottom of the shield electrode and a bottom surface of the trench, the high-k shield dielectric has a second portion disposed between the shield electrode and the sidewall of the trench.

14. The apparatus of claim 12, wherein the high-k shield dielectric has a portion in contact with the gate electrode.

15. The apparatus of claim 12, wherein the high-k shield dielectric has a portion lateral to the inter-electrode dielectric.

16. The apparatus of claim 12, wherein the shield electrode has a width across a top portion wider than a width across a bottom portion.

17. The apparatus of claim 12, wherein the shield electrode has a stepped shape.

18. The apparatus of claim 12, wherein the low-k dielectric portion is in contact with a bottom of the shield electrode.

19. A method, comprising:
 forming a trench having a sidewall in a semiconductor region of a substrate;
 forming a shield dielectric having a low-k dielectric portion and a high-k dielectric portion;
 forming a shield electrode in the trench and insulated from the sidewall of the trench by at least the shield dielectric, the high-k dielectric portion being insulated from the sidewall by at least the low-k dielectric portion, the high-k dielectric portion being in contact with the shield electride;
 forming a gate electrode disposed in the trench and at least partially surrounded by a gate dielectric; and
 forming an inter-electrode dielectric disposed between the shield electrode and a gate electrode.

20. The method of claim 19, wherein the shield electrode has a width across a top portion wider than a width across a bottom portion.

21. The method of claim 19, wherein the shield electrode has a stepped shape.

22. The method of claim 19, wherein the shield electrode has a width greater than a width of the high-k dielectric portion.

23. The method of claim 19, wherein the shield electrode has a top surface at a same height as a top surface of the high-k dielectric portion.

* * * * *